United States Patent [19]
Ünlü et al.

[11] Patent Number: 5,767,507
[45] Date of Patent: Jun. 16, 1998

[54] POLARIZATION SENSITIVE PHOTODETECTORS AND DETECTOR ARRAYS

[75] Inventors: M. Selim Ünlü, Dorchester; Bora Onat, Allston, both of Mass.

[73] Assignee: Trustees of Boston University, Boston, Mass.

[21] Appl. No.: 679,922

[22] Filed: Jul. 15, 1996

[51] Int. Cl.$^6$ ........................................... G02F 1/01
[52] U.S. Cl. .................... 250/225; 250/214.1; 385/11; 369/110; 257/21
[58] Field of Search ..................... 250/225, 227.11, 250/226, 214.1; 385/11, 14, 131; 369/110, 112, 44.23, 44.24, 107, 109; 356/368, 369; 257/18-22

[56] References Cited

U.S. PATENT DOCUMENTS

| | | | |
|---|---|---|---|
| 5,117,469 | 5/1992 | Cheung et al. | 257/18 |
| 5,208,800 | 5/1993 | Isobe et al. | 369/112 |
| 5,438,414 | 8/1995 | Rust | 356/364 |
| 5,523,994 | 6/1996 | Ando et al. | 369/112 |
| 5,528,575 | 6/1996 | Saito | 369/110 |
| 5,570,334 | 10/1996 | Kim | 369/107 |
| 5,574,289 | 11/1996 | Aoki et al. | 257/22 |

FOREIGN PATENT DOCUMENTS

| | | |
|---|---|---|
| 486265 A2 | 11/1991 | European Pat. Off. |
| 592075 A1 | 7/1993 | European Pat. Off. |
| US 9617188 | 2/1997 | WIPO . |

OTHER PUBLICATIONS

S. Ura, et al.: "Focusing Grating Couplers for Polarization Detection," Journal of Lightwave Technology, vol. 6, No. 6, pp. 1028-1033, Jun. 1988.

M. Ünlü, et al.: "Transient Simulation of Resonant Cavity Enhanced Heterojunction Photodiodes," IEEE Photonics Technology Letters, vol. 4, No. 12, pp. 1366-1369, Dec. 1992.

Y. Leblebici, et al.: "Transient Simulation of Heterojunction Photodiodes –Part I: Computational Methods," Journal of Lightwave Technology, vol. 13, No. 3, pp. 396-405, Mar. 1995.

M. Ünlü, et al.: "Transient Simulation of Heterojunction Photodiodes –Part II: Analysis of Resonant Cavity Enhanced Photodetectors," Journal of Lightwave Technology, vol. 13, No. 3, pp. 406-415, Mar. 1995.

M. Ünlü, et al.: "Resonant Cavity Enhanced Photonic Devices," Journal of Applied Physics, vol. 78, No. 2, pp. 607-639, Jul. 15, 1995.

M. Ünlü, et al.: "Polarisation Sensing With Resonant Cavity Enhanced Photodetectors," Electronics Letters, vol. 32, No. 6, pp. 591-593, Mar. 14, 1996.

B. Onat, et al.: "Polarization Sensing with Resonant Cavity Enhanced Photodetectors," IEEE Journal of Selected Topics in Quantum Electronics, vol. 2, No. 1, pp. 135-140, Apr. 1996.

*Primary Examiner*—Que Le
*Attorney, Agent, or Firm*—Hunton & Williams

[57] ABSTRACT

A device for detecting polarization of light comprising a first photodetector tuned to absorb TE polarization, a second photodetector tuned to absorb TM polarization, and a circuit for comparing an output from the first and second photodetector for generating a polarization output. The first photodetector comprises a first reflector, an absorption layer on top of the first reflector, and a second reflector on top of the absorption layer. The second photodetector comprises a third reflector on top of an absorption layer, and a fourth reflector disposed under absorption layer.

29 Claims, 24 Drawing Sheets

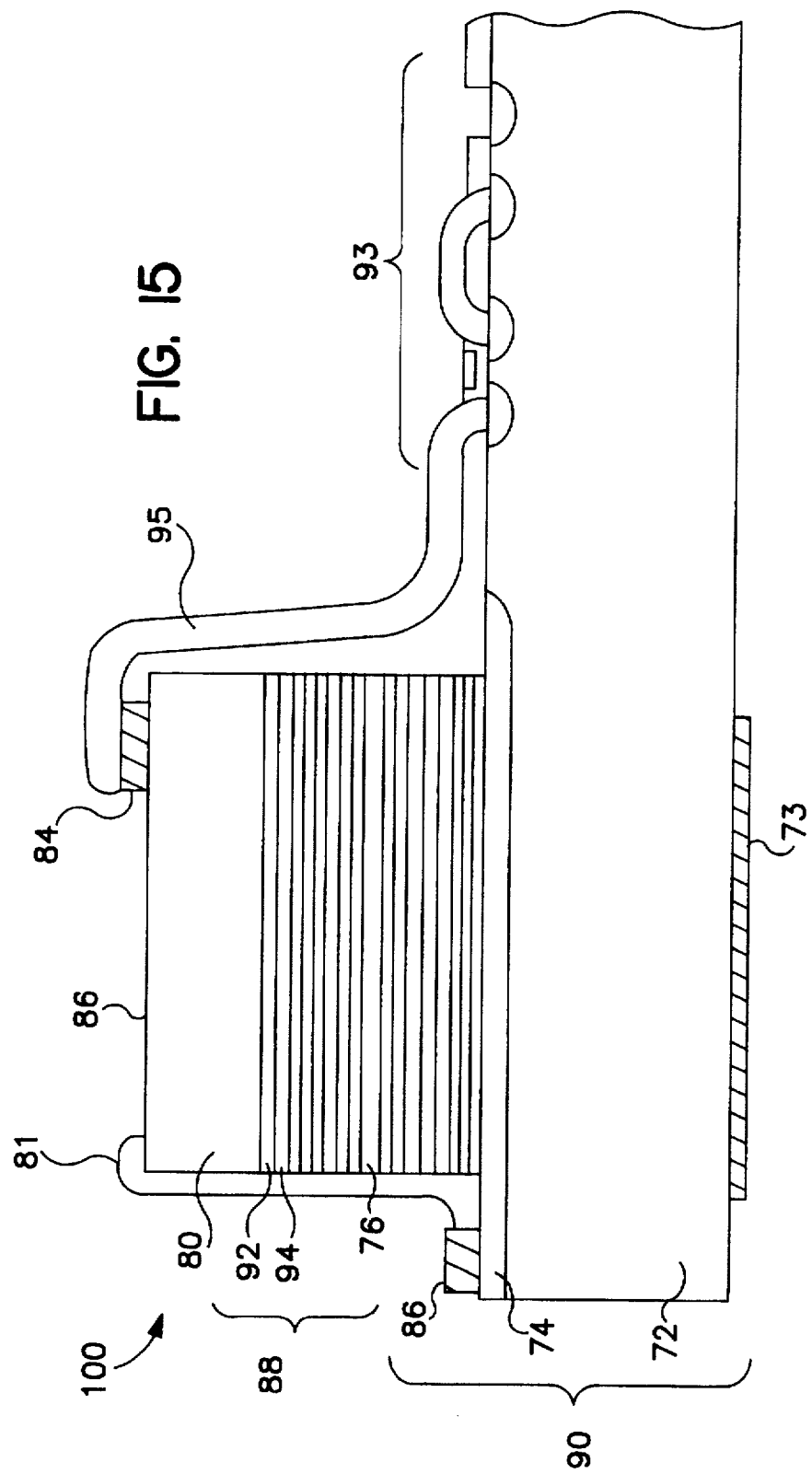

POLARIZATION SENSITIVE PHOTODETECTORS AND DETECTOR ARRAYS

FIELD OF THE INVENTION

This invention relates to photodetection. More specifically, this invention relates to detection of polarization of radiation.

BACKGROUND OF THE INVENTION

Present photodetectors detect the presence of light. Presence of light is useful, but additional information may be desired. It may be desirable to detect the polarization of the light. Polarization sensing has various applications ranging from magneto-optical data storage to imaging. In imaging, the polarized light sensitivity is expected to underlie a visual quality similar to color vision that may permit the detection of objects that are blended in the background. In magneto-optical (M-O) drives, the content of the stored data is coded as a change in the polarization of light. The conventional M-O reading head configuration employs polarizing beam splitters and separate dedicated detectors for the two polarization components. The use of bulk discrete optical components of this type requires individual alignment in three spatial and three angular coordinates with narrow tolerances resulting in increasing cost and limited range of applications.

Other devices have been attempted to make the packaging of the optical system simpler and tolerant to alignment variations. For example, a cascaded holographic sensor element has been proposed but is expected to be highly sensitive to alignment and wavelength variations as well. Each of these devices also continues to suffer from the disadvantage of heavy and bulky optical elements which limit access time of the data reading head. Other disadvantages with the prior systems also exist.

SUMMARY OF THE INVENTION

Accordingly, a need has arisen for a device which provides for intensity and polarization sensitivity and detection into a single device without requiring the use of beam splitters.

Accordingly, it is an object of the present invention to meet the above-described need.

It is an object of the present invention to provide a device for detecting the absolute value or the variation in polarization for linearly polarized light. It is also an object to provide a device in which both intensity and polarization of light is simultaneously detected.

It is another object of the present invention to provide an integrated polarization selectivity and detection device in a single semiconductor device structure.

It is also an object of the present invention to provide a photodetector structure which is sensitive to the polarization of the incident radiation, the sensitivity being controlled by recessing the top surface of the detector allowing for the monolithic fabrication of detector arrays with varying sensitivities to TE and TM polarizations.

It is further an object of the present invention to provide a detector array comprising at least two photodetectors which can be used to measure the polarization of the incident light.

It is further an object of the present invention to provide two vertically integrated photodetectors which are sensitive to the polarization of light.

It is another object of the present invention to provide a device for detecting absolute polarization and changes in polarization.

Accordingly, an embodiment of the present invention comprises a device for detecting polarization of light comprising a first photodetector tuned to absorb TE polarization, a second photodetector tuned to absorb TM polarization, and a circuit for comparing an output from the first and second photodetector for generating a polarization output.

According to another embodiment of the present invention, a device for detecting polarization of light comprises a substrate, a first photodetector tuned to absorb TE polarization, a second photodetector disposed on the substrate and tuned to absorb TM polarization, and a circuit for comparing an output from the first and second photodetector for generating a polarization output.

According to yet another embodiment of the present invention, a method for detecting polarization of light comprises the steps of absorbing TE polarization using a first photodetector, absorbing TM polarization using a second photodetector, and comparing an output from the first and second photodetector for generating a polarization output.

According to another embodiment of the present invention, a monolithic VLSI device for detecting polarization of light comprises a substrate, a first photodetector tuned to absorb TE polarization and formed on the substrate, a second photodetector disposed on the substrate and tuned to absorb TM polarization and formed on the substrate, and a circuit for comparing an output from the first and second photodetector for generating a polarization output and formed on the substrate.

According to yet another embodiment of the present invention, a photodetector system for detecting the positioning of a light source and the polarization of the light generated by the light source comprises a plurality of pairs of photodetectors for detecting light from the light source, each pair comprising a first photodetector tuned to absorb TE polarization, and a second photodetector disposed on the substrate and tuned to absorb TM polarization and formed on the substrate. The photodetector system also comprises a circuit for comparing an output from at least one of the first and second photodetectors for generating a polarization output and a circuit for comparing an output from each of the first photodetectors from the plurality of pairs with a predetermined output to determine whether the light source is in a predetermined desired position.

According to a further embodiment of the present invention, a magneto-optical drive device comprises a light source for generating a light output directed onto an optical storage medium, and a mechanism for receiving light reflected from the optical storage medium and detecting polarization of the light. In one embodiment, the mechanism comprises a first photodetector tuned to absorb TE polarization, and a second photodetector tuned to absorb TM polarization. The optical drive system also comprises a circuit for comparing an output from the first and second photodetector for generating an output indicating a value stored on the optical storage medium.

According to yet another embodiment of the present invention, a CCD array device for detecting polarization of an image comprises a plurality of detectors arranged in rows and columns, each detector comprising a first photodetector tuned to absorb TE polarization, and a second photodetector tuned to absorb TM polarization. The CCD array device also comprises a processor connected to the plurality of detectors for generating an array of polarization values for an image received by the detectors.

3

Other objects and advantages of the present invention may be appreciated upon review of the specification and drawings.

BRIEF DESCRIPTION OF THE DRAWINGS

FIG. 15 depicts an embodiment of a monolithic VLSI circuit according to the present invention.

DETAILED DESCRIPTION OF THE PREFERRED EMBODIMENTS

The principle of operation is based on the resonant cavity enhanced (RCE) photodetectors. The RCE structure consists of a thin absorption region placed in an asymmetric Fabry-Perot cavity. The cavity is formed by top and bottom reflectors which may be fabricated by various methods (for example, alternating layers of quarter-wavelength dielectrics, i.e., Distributed Bragg Reflectors). For example, the top reflector may be formed of a semiconductor/air interface and the bottom reflector may comprise a DBR. When the optical length of the cavity satisfies the resonance condition, the cavity enhances the optical fields and the detector response is drastically increased.

The quantum efficiency for a RCE detector can be expressed as $$\eta = \left\{ \frac{(1 + R_2 e^{-\alpha d})}{1 - 2\sqrt{R_1 R_2 e^{-\alpha d}} \cos(2\beta L + \psi_1 + \psi_2) + R_1 R_2 e^{-2\alpha d}} \right\} \times (1 - R_1)(1 - e^{-\alpha d}) \quad (1)$$

where $\alpha$ and $d$ are the absorption coefficient and thickness for the thin absorber, $\beta$ is the optical propagation constant, $L$ is the length of the cavity, and $R_1$, $\psi_1$ and $R_2$, $\psi_2$ are the amplitude and phase of the top and bottom reflectors, respectively. If the light is incident to the surface at an angle $\theta$ with the normal, L, is replaced by L/cos $\theta$. When the optical length of the cavity satisfies the resonance condition, the cavity enhances the optical fields and the detector response is drastically increased. The peak $\eta$ at the resonant wavelengths can be derived by imposing the resonant condition in Eqn. 1.

$$\eta_{max} = \left\{ \frac{1 + R_2 e^{-\alpha d}}{(1 - \sqrt{R_1 R_2 e^{-\alpha d}})^2} \right\} \times (1 - R_1)(1 - e^{-\alpha d}) \quad (2)$$

Figure 13:
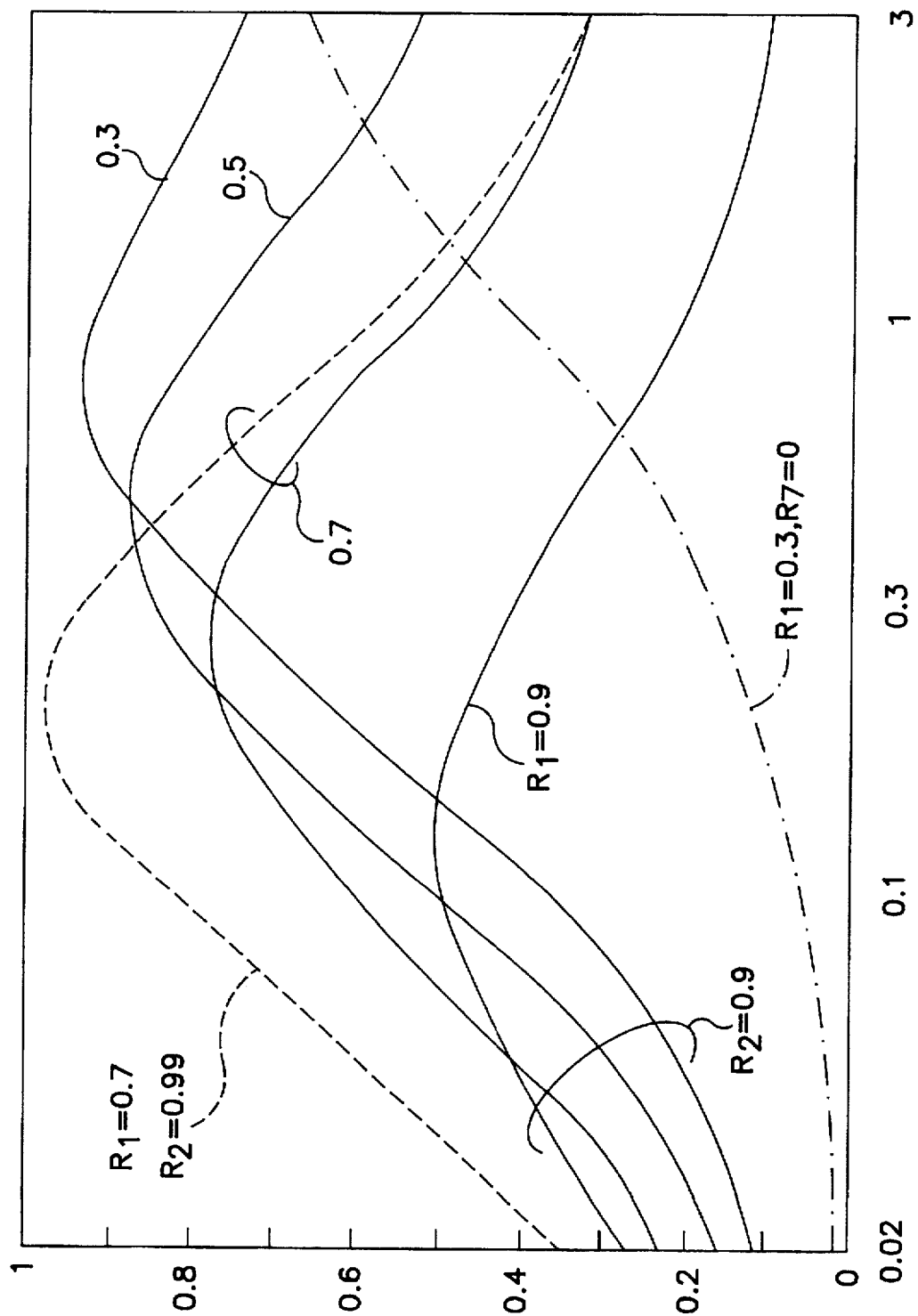
FIG. 13 is a graph illustrating quantum efficiency for various top and bottom reflectivities according to embodiments of the present invention.

If the length of the cavity is altered (for example, by surface recessing) then the sensitivity is reduced below that of a conventional detector structure without the cavity. The enhancement/reduction in the detector response is a strong function of the top reflectivity. The origin of the drastic enhancement in $\eta$ is the greatly increased amplitude of the electric field inside a high Q resonant cavity which causes more energy to be absorbed in the active region. An equivalent interpretation is that an individual photon is multiply-reflected at the mirrors and therefore makes many passes through the absorption region for varying mirror reflectivities as a function of $\alpha d$. For small thin absorbers ($\alpha d$ about equal to 0.1), i.e., a low loss cavity, the enhancement factor exceeds 10. FIG. 13 illustrates the quantum efficiency, $\eta$, at resonance as a function of $\alpha d$ for various top ($R_1$) and bottom ($R_2$) mirror reflectivities. In FIG. 13, solid lines represent $R_2=0.9$ and $R_1=0.9$, 0.7, 0.5, and 0.3 as indicated. Dashed lines represent $R_2=0.99$ and $R_1=0.7$. Dotted dashed lines represent the conventional detector case in which $R_2=0$ and $R_1=0.3$. For a typical native semiconductor surface ($R_1 \cong 0.3$), the $R_2=0$ and 0.9 curves illustrate the contrast between the conventional and the RCE cases. RCE detection improves $\eta$ by a factor of about 6.5 for a 0.1 micron thick absorption layer ($\alpha = 10^4$ cm$^{-1}$). Quantum efficiency may further be enhanced by higher reflectivity mirrors. The $R_2$ =0.99, $R_1$=0.77 curve reaches a maximum η in excess of 98%.

For off-normal incidence of light, the reflectivity of a semiconductor/air interface may be significantly different for TE and TM polarizations. At Brewster's angle, for example, TM reflectivity vanishes and TE reflectivity is approximately 0.75 for the GaAs-air interface. Therefore, sensitivity, i.e., quantum efficiency, is a strong function of the cavity length for TE polarization while sensitivity for TM is invariant.

A pair of monolithically integrated RCE photodetectors with cavity lengths tuned for resonance and anti-resonance for TE polarization provide a large contrast. A comparison of the current from these two detectors under equal illumination yields the absolute polarization of the incident light. In an embodiment in which the detectors are horizontally arranged, equal illumination may be used to ensure proper functioning. In addition, however, vertically arranged photodetectors may be used in which uniform illumination is less essential. The described invention is applicable to most material systems and detector structures and various wavelength (λ) regions.

Figure 1:
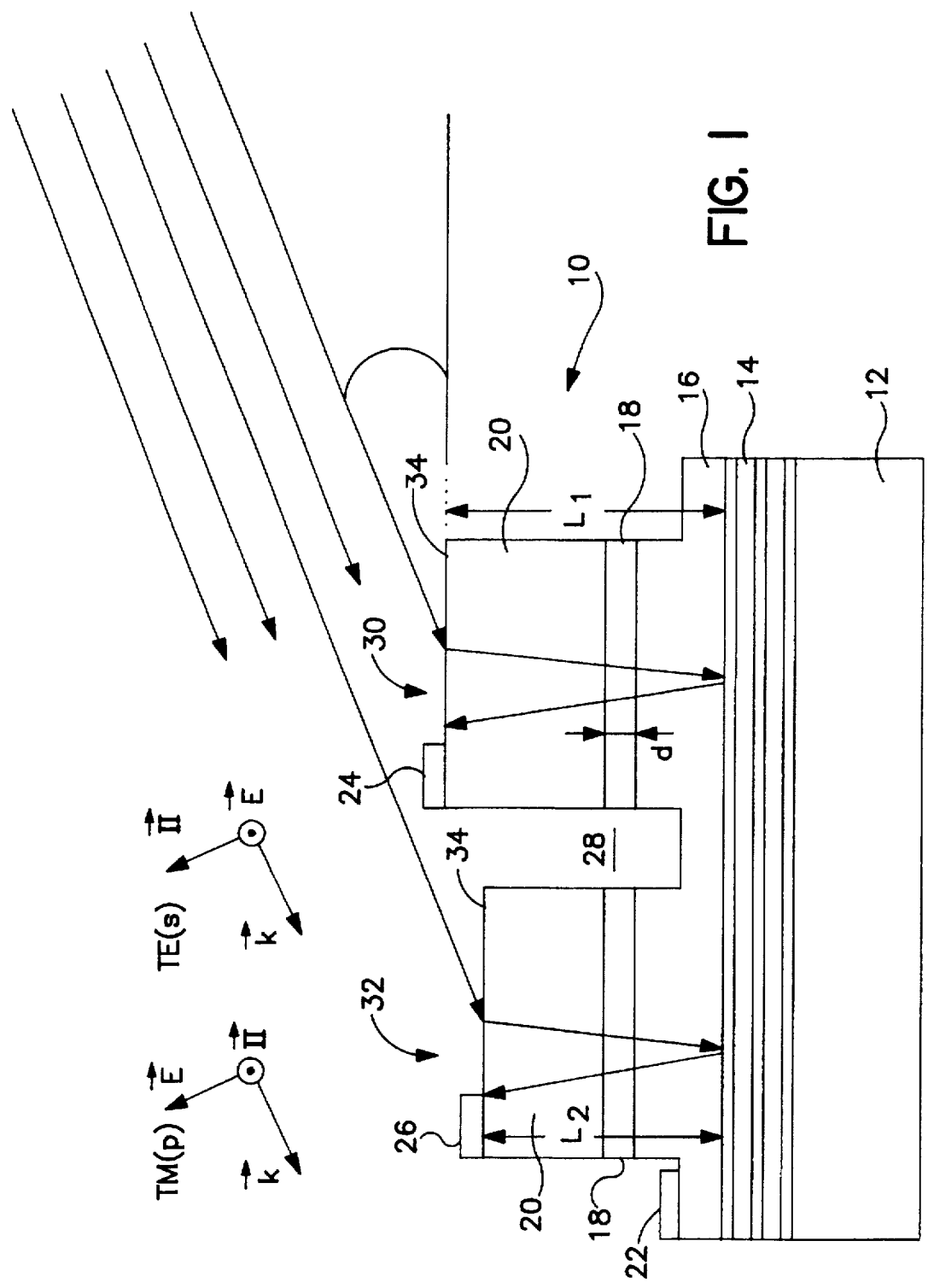
FIG. 1 depicts a schematic of a polarization sensitive detector array according to an embodiment of the present invention.

FIG. 1 comprises a photodetector structure 10 according to an embodiment of the present invention. Photodetector structure 10 comprises a substrate 12, a bottom reflector 14, a bottom layer 16, an absorption layer 18, and a top layer 20. A bottom electrical contact 22 and a first top electrical contact 24 and a second top electrical contact 26 may also be provided on bottom layer 16 and top layer 20 respectively.

In one embodiment, a cavity 28 may be formed in bottom layer 16, absorption layer 18, and top layer 20. Two detectors may thus be formed: first detector 30 and second detector 32, which are separated by cavity 28. First detector 30 and second detector 32 may have different cavity lengths. First detector 30 may have a cavity length of $L_1$ while second detector 32 may have a cavity length of $L_2$. In a preferred embodiment, a cavity length may be provided such that the maximum cavity length at any point equals about 2.5 micrometers, for example. Top layer 20 and air form a top reflector 34 on both first detector 30 and second detector 32. Bottom reflector 14 provides reflectance from the bottom.

In one embodiment, top layer 20 may comprise GaAs. Absorption layer 18 may comprise InGaAs, for example, such as $In_{0.1}Ga_{0.9}As$ and have a depth, d, of about 0.1 microns. Other depths may also be used. Bottom layer 16 may comprise AlGaAs, for example. These layers may also comprise GaAs, AlGaAs, InGaAs, InP, InGaAs, InAlAs, InGaAs, GaAs, AlAs, Ge, Si, $SiO_2$, SiGe, GaP, AlP, GaN, AlGaN, InGaN, or InAlGaN or other semiconductor or dielectric materials.

Figure 2:
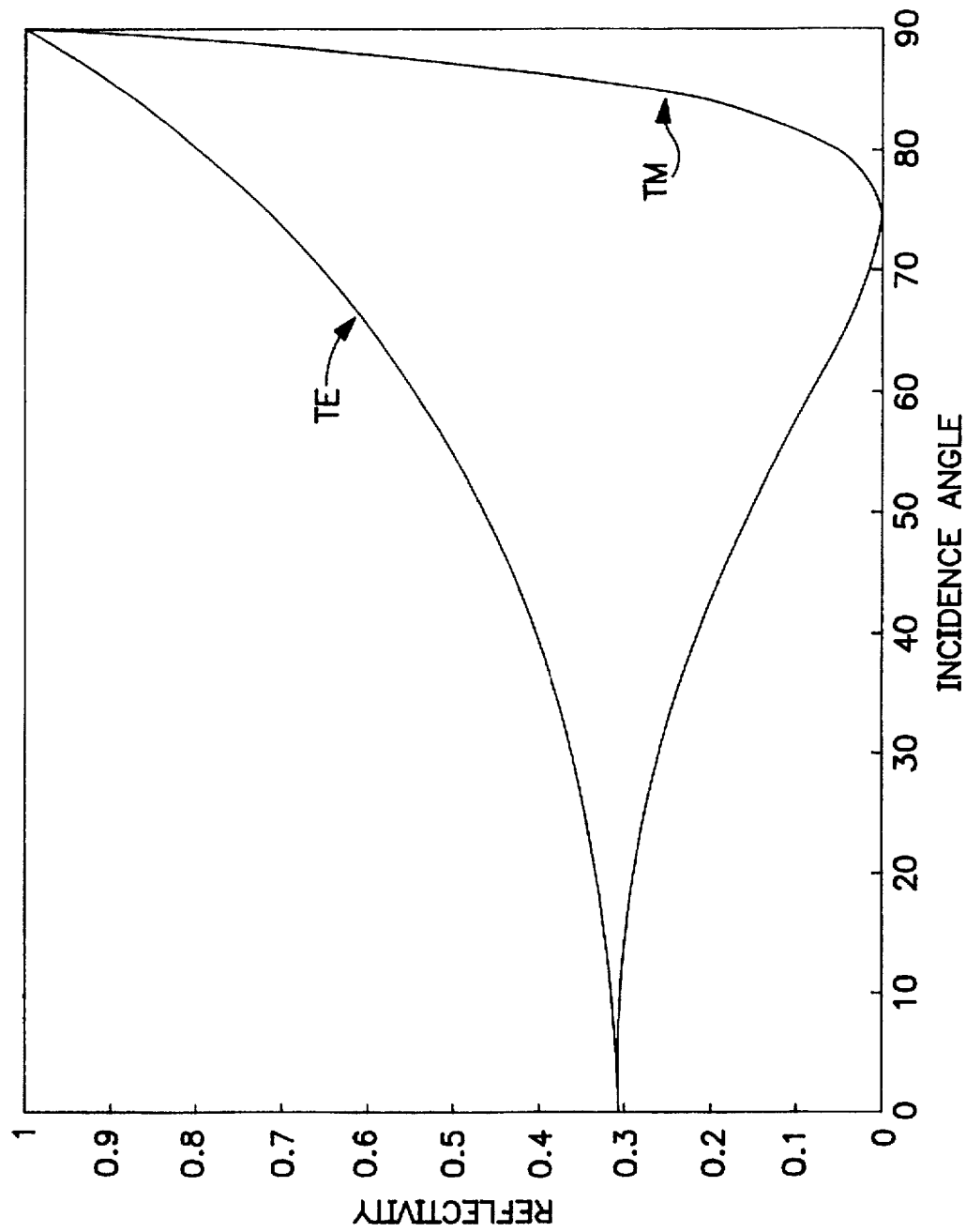
FIG. 2 is a graph depicting reflectivity versus incidence angle for both TE and TM polarized light according to a typical dielectric-air incidence boundary device.
Figure 3:
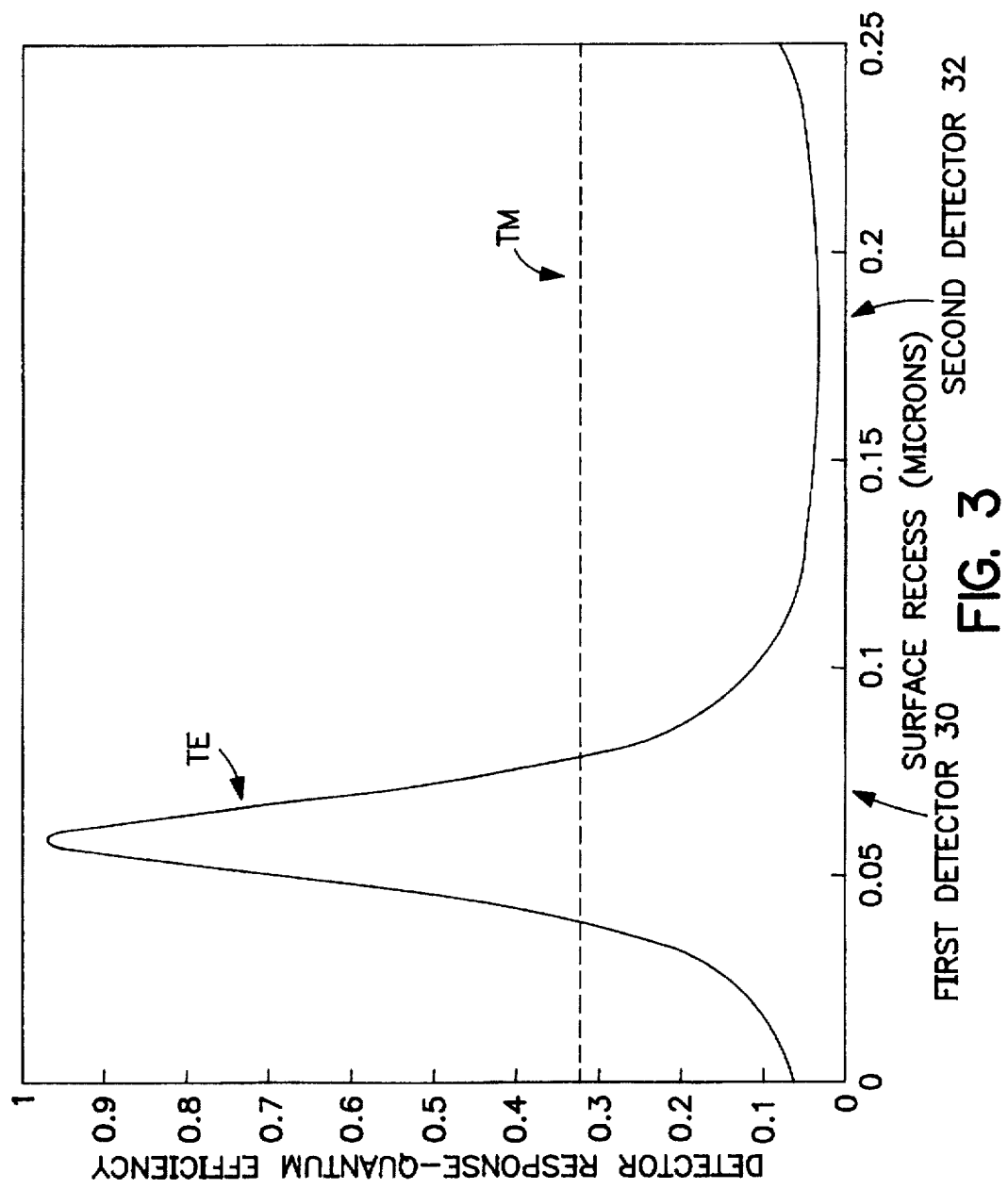
FIG. 3 is a graph depicting detector response versus surface recess for both TE and TM polarized light according to one embodiment of the present invention.

By selecting recess values for each of the detectors in the array, for example, by selecting two recess values corresponding to the maximum and minimum of the TE quantum efficiency, a sharp contrast in TE-response may be achieved. For example, at normal incidence, the GaAs/air interface provides a reflectivity of 0.32. This reflectivity is a strong function of incidence angle and polarization as shown in FIG. 2. As FIG. 2 illustrates, the reflectivity of TE and TM diverge up to the Brewster angle (which in this case is about 74 degrees) as the incidence angle increases away from zero. The present detector structure utilizes the polarization dependent variation of the reflectivity of this interface under oblique incidence. FIG. 2 shows the incidence angle dependence of the surface reflectivity for GaAs/air interface for light having a wavelength of λ=900 nm for TE and TM polarizations. At a wavelength of about 900 nm, the refractive index of GaAs is n=3.55. At 74° incidence angle (Brewster angle), TM-reflectivity vanishes, but TE-reflectivity is quite large, e.g., about 0.75. Therefore, sensitivity is a strong function of the cavity length for TE polarization. FIG. 3 illustrates that sensitivity is a strong function of the cavity length for TE polarization (TE is represented by a solid line in FIG. 3). Therefore, according to the present invention, since cavity length may be controlled by recessing the top surface, the sensitivity of a device to TE polarization may likewise be controlled. As for TM sensitivity, FIG. 3 illustrates that TM sensitivity is invariant to cavity length (TM is represented by the dashed line in FIG. 3—TM remains constant). In FIG. 3, the wavelength of light is 900 nm, the incidence angle is 74°, the maximum length, $L_{max}$=2.5 microns, the absorption coefficient and depth, αd=0.2, the amplitude of the bottom reflector, $R_2$, is about 1.0, and the refractive index, n=3.55 for the GaAs.

According to the present invention, first and second detectors 30 and 32 may be constructed to have very different sensitivities for TE polarization while their responses to TM polarization are equal. For example, in FIG. 1, first detector 30 may be adjusted to achieve the maximum sensitivity of the resonant cavity for TE polarization for the selected incidence angle. For example, for light having a wavelength of about 900 nm, the detector may have a recess of about 0.07 microns, such that the length of first detector 30, $L_1$=2.43 microns. In this embodiment, the surface of second detector 32 may be recessed such that the incident TE polarized light is rejected and TM polarized light is permitted to pass through for detection. For example, for light having a wavelength of about 900 nm, second detector 32 may be recessed by about 0.175 microns, such that the length of second detector 32, $L_2$=2.325 microns. The detector responses of first detector 30 and second detector 32, $D_1$ and $D_2$ respectively, may be expressed as $$D_1 = S_{1,TE} \cdot TE + S_{1,TM} \cdot TM \quad (3)$$

that is:

$$D_2 = S_{2,TE} \cdot TE + S_{2,TM} \cdot TM \quad (4)$$

$$\begin{bmatrix} D_1 \\ D_2 \end{bmatrix} = \begin{bmatrix} S_{1,TE} & S_{1,TM} \\ S_{2,TE} & S_{2,TM} \end{bmatrix} \cdot \begin{bmatrix} TE \\ TM \end{bmatrix} = |S| \cdot \begin{bmatrix} TE \\ TM \end{bmatrix} \quad (5)$$

where $S_{i,TE}$ and $S_{i,TM}$ represent the sensitivity of first and second detectors 30 and 32 (represented by subscripts i=1 and i=2, respectively) to different perpendicular polarizations. In the matrix of Eqn. 5, $D_1$ and $D_2$ represent detector current output and TE and TM represent the incident power of the corresponding polarizations. If the two detectors have the same sensitivity for different polarizations as in conventional designs, then Eqns. 3 and 4 are identical. For the described device structure, there is a big contrast in the response to different polarizations. Therefore, TE and TM powers can be evaluated from the detector signals as:

$$\begin{bmatrix} TE \\ TM \end{bmatrix} = |S|^{-1} \cdot \begin{bmatrix} D_1 \\ D_2 \end{bmatrix} \quad (6)$$

For the device parameters of FIG. 3, for example if $S_{1,TE}$=0.98, $S_{2,TE}$=0.03, and $S_{1,TM}$=$S_{2,TM}$=0.33, the following equation is obtained:

$$\begin{bmatrix} TE \\ TM \end{bmatrix} = \begin{bmatrix} 1.053 & -1.053 \\ -0.096 & 3.126 \end{bmatrix} \cdot \begin{bmatrix} D_1 \\ D_2 \end{bmatrix} \quad (7)$$

In one embodiment, the RCE detector structures may be formed in GaAs/(In,Al)GaAs material systems. Bottom reflector 14 may be formed by a 15 period GaAs/AlAs DBR mirror. Bottom reflector 14 serves to reflect light which passes through top layer 20, absorption layer 18 and bottom layer 16 back up through bottom layer 16, absorption layer 18 and top layer 20. Likewise, top reflector 34 may reflect light back through top layer 20, absorption layer 18, and bottom layer 16, thereby increasing the amount of the light which is absorbed in absorption layer 18. For the GaAs/AlAS DBR mirror, the $R_2$=about 1.0. The thin InGaAs absorption region placed in the GaAs cavity extends the photosensitivity beyond the GaAs absorption edge where optical losses in the other layers are negligible. At around the wavelength of about 900 nm, only the InGaAs region absorbs light, thus the device provides a low-loss resonant cavity. It is further important to note that although differences in TE and TM reflectivity are greatest at the Brewster angle, a large difference also exists at many other incidence angles as illustrated in FIG. 3.

To determine the absolute polarization with this embodiment, one only needs to have a device for solving two equations and two unknowns. Because each detector has a predetermined sensitivity to one of the polarization components, each detector's output is directly related to the amount of the other type of polarization received. Therefore, because there are two polarizations and two unknowns, a device which solves this type of problem may be used.

Figure 4:
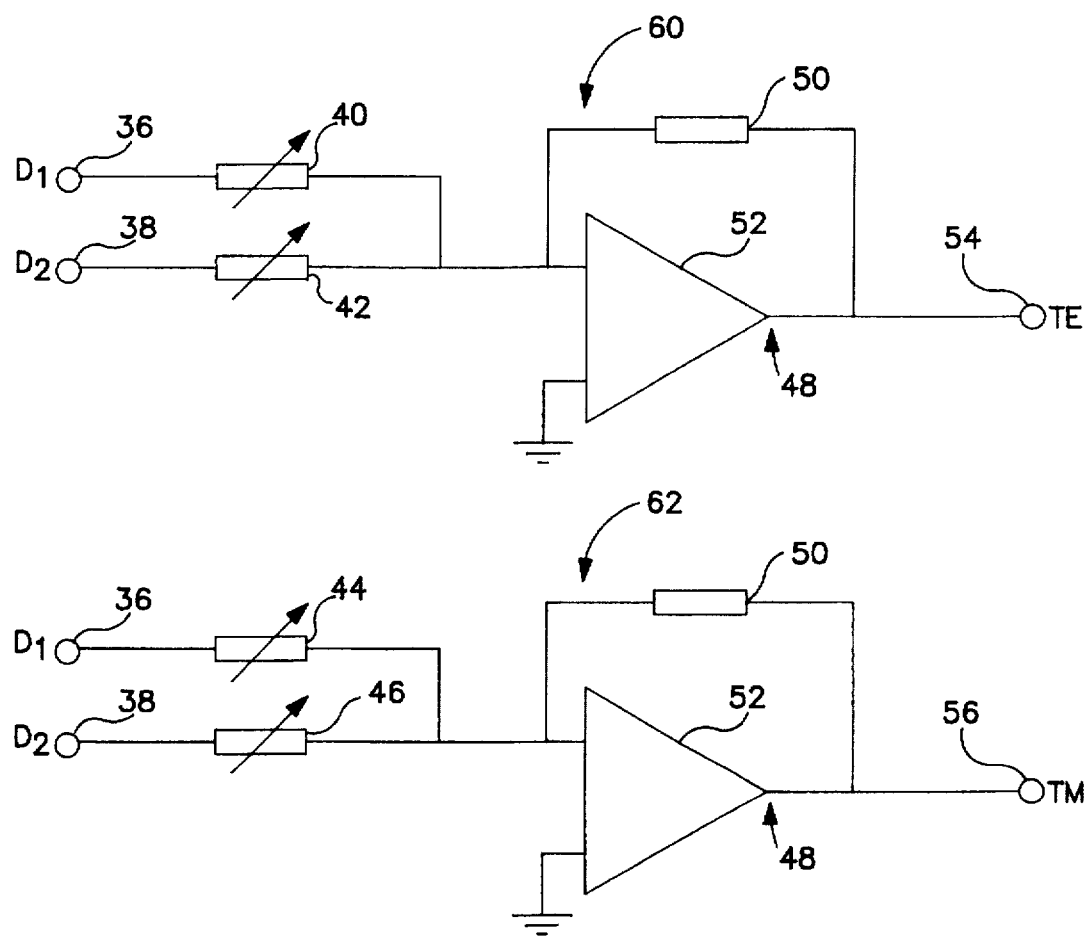
FIG. 4 depicts a circuit for polarization sensitive detection according to an embodiment of the present invention.

For example, a circuit as shown in FIG. 4 may be used to evaluate these equations. In FIG. 4, the variable resistor values are set according to the matrix coefficients of $[S]^{-1}$ as in Eqn. 5. The circuit of FIG. 4 comprises a first detector input 36 and a second detector input 38 which are connected to the output of first detector 30 and second detector input 32, respectively. A first subcircuit 60 comprises a first variable resistor 40, a second variable resistor 42, an amplification circuit 48, and an output 54. Amplification circuit 48 may comprise a third resistor 50 and an operational amplifier 52. A second subcircuit 62 may comprise a third variable resistor 44, a fourth variable resistor 46, amplification circuit 48, and an output 56. Output 54 provides an output representing the value of the TE component and output 56 provides an output representing the value of the TM component. As discussed above, the value of first through fourth resistors 40–46 may be determined by the matrix coefficients in Eqn. 5. Therefore, for example, first resistor 40 may value a value of about 980 ohms, second resistor 42=about 30 ohms, third resistor 44=about 330 ohms and fourth resistor 46=about 330 ohms.

To determine the polarization, the ratio of the power in the two polarization components can be then evaluated as:

The described detector array of two detectors measures the relative value of the TE and TM polarization components accurately. The described invention is applicable to most material systems and detector structures and various wavelength ($\lambda$) regions. For example, a GaAs/AlGaAs/InGaAs and Si/SiO$_2$/Si$_3$N$_4$ photodetector structure may be used The present invention may also be used for determining variations in polarization. By using the ratio of photocurrents (TE/TM) derived and storing this result, any change in polarization may be detected by monitoring the photocurrent ratio for changes. Thereby, for example, in a magneto-optical data device, the present detector system may be used to detect the presence of either a one or a zero, a one representing one level of polarization and a zero representing another, the change in polarization indicating a change from one to zero or zero to one.

According to another embodiment of the present invention, the two detectors may be stacked. This invention provides a detector which operates effectively with less reliance on the illumination area (spot size) of the light. As with the embodiment of FIG. 1, the basic principle is based on a Distributed Bragg Reflector (DBR) mirror placed between the two detector structures. This DBR mirror has significantly different reflectivities for TE and TM polarizations for large incidence angles.

Figure 5:
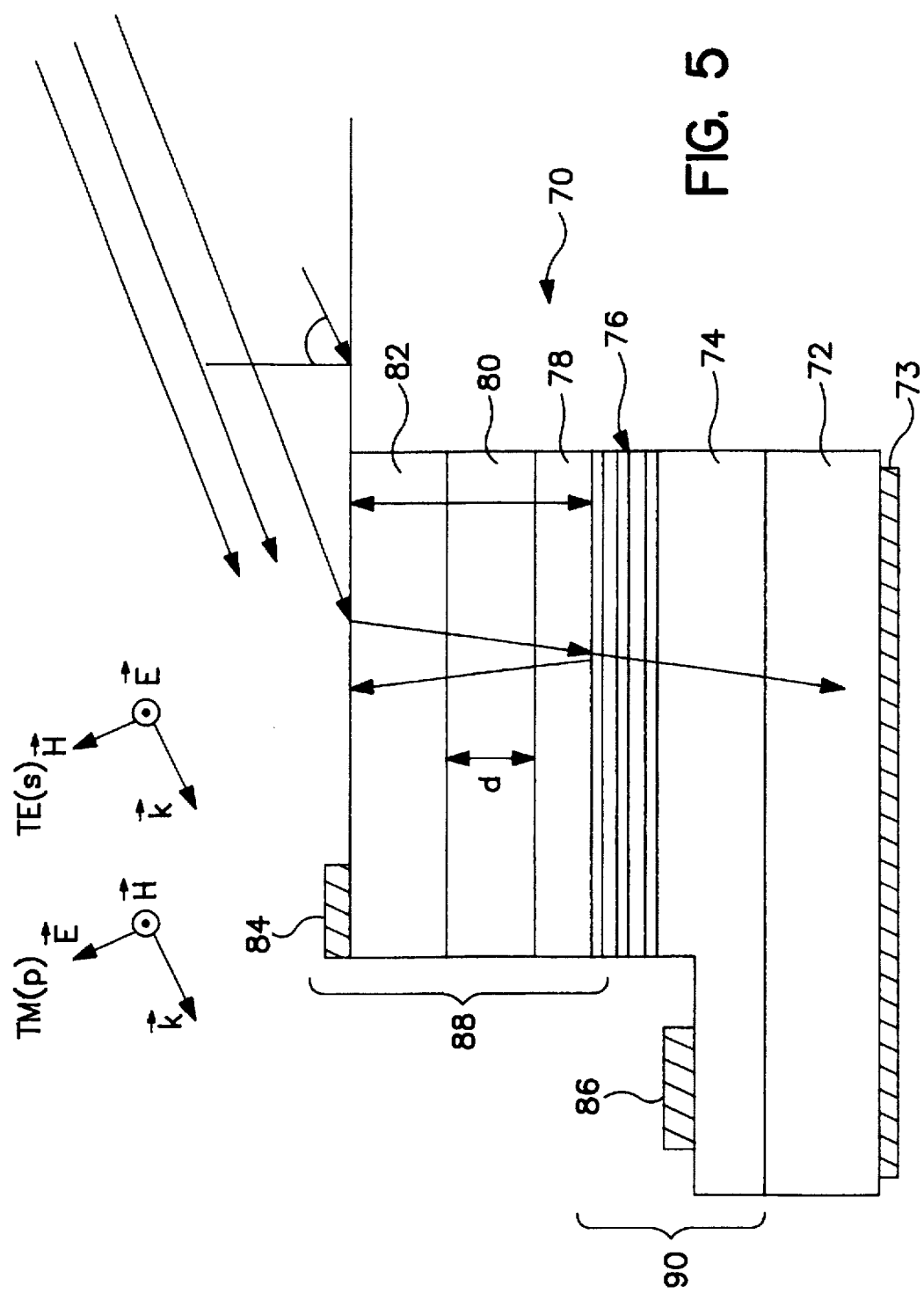
FIG. 5 depicts a schematic of a polarization sensitive detector according to an embodiment of the present invention.

FIG. 5 depicts a photodetector structure 70 according to an embodiment of the present invention. Photodetector structure 70 comprises a substrate 72, a second absorption region 74, a mirror structure 76, a separating layer 78, a first absorption region 80, and a top layer 82. Photodetector structure 70 also comprises a first electrical contact device 84, a second electrical contact device 86, and a third electrical contact device 73. Top layer 82, first electrical contact device 84, first absorption region 80, and third electrical contact device 73 form a first detector 88. Second absorption layer 74, second electrical contact device 86, and third electrical contact device 73 form a second detector 90. First detector 88 is situated in a resonant cavity bounded by mirror structure 76, which may be, for example, a DBR device, and the interface between top layer 82 and air. In a preferred embodiment, top layer 82 may comprise a semiconductor or dielectric material. The present invention utilizes the polarization dependent variation of the reflectivity ($R_1$) of the interface between top layer 82 and air under oblique incidence. In a preferred embodiment, top layer 82 may comprise GaAs. Other substances may also be used including for example, GaAs, AlGaAs, InGaAs, InP, InGaAs, InAlAs, InGaAs, GaAs, AlAs, Ge, Si, SiO$_2$, SiGe, GaP, AlP, GaN, AlGaN, InGaN, or InAlGaN or other semiconductor or dielectric materials.

Figure 6:
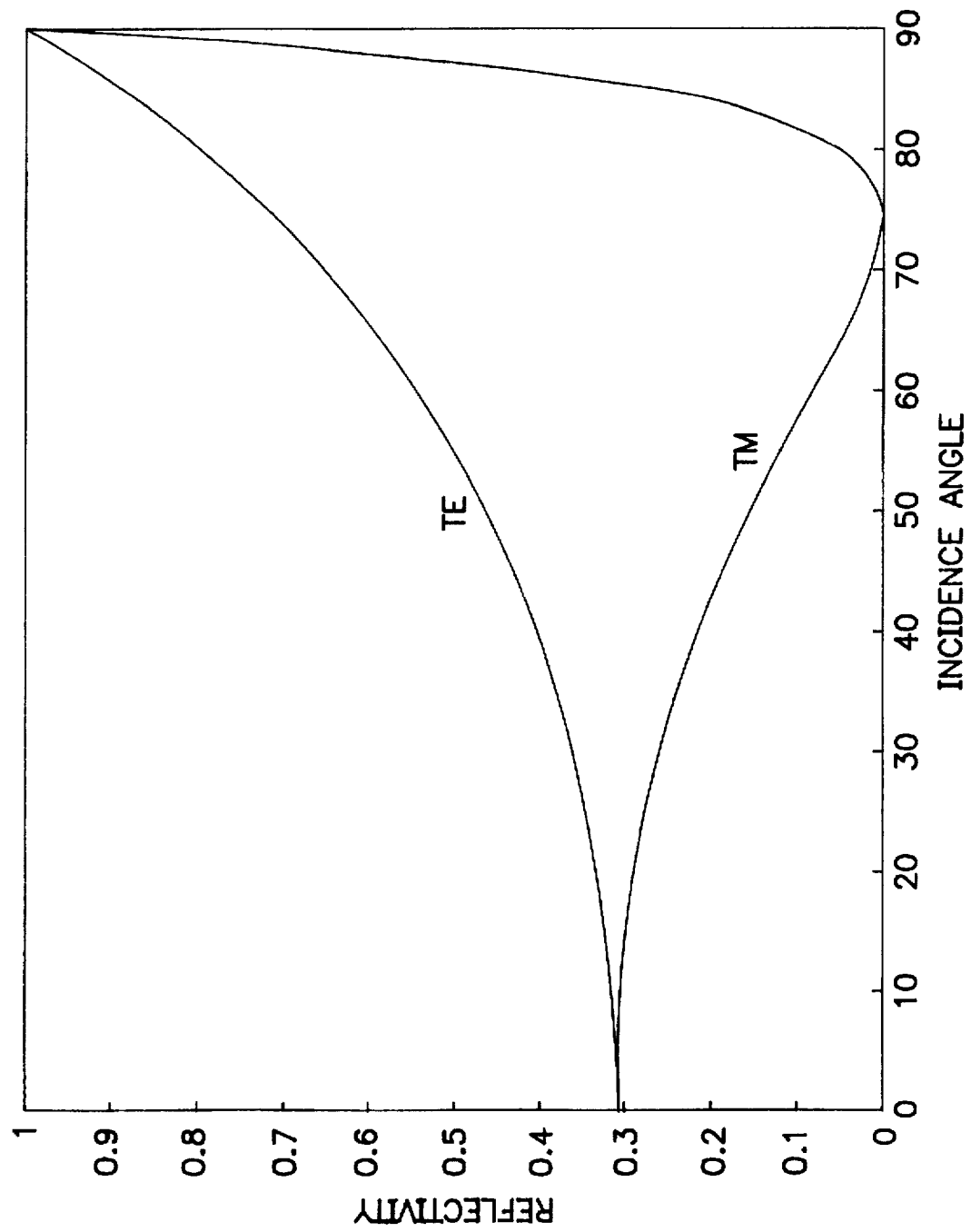
FIG. 6 is a graph depicting reflectivity versus incidence angle for both TE and TM polarized light according to an embodiment of the present invention.
Figure 7A:
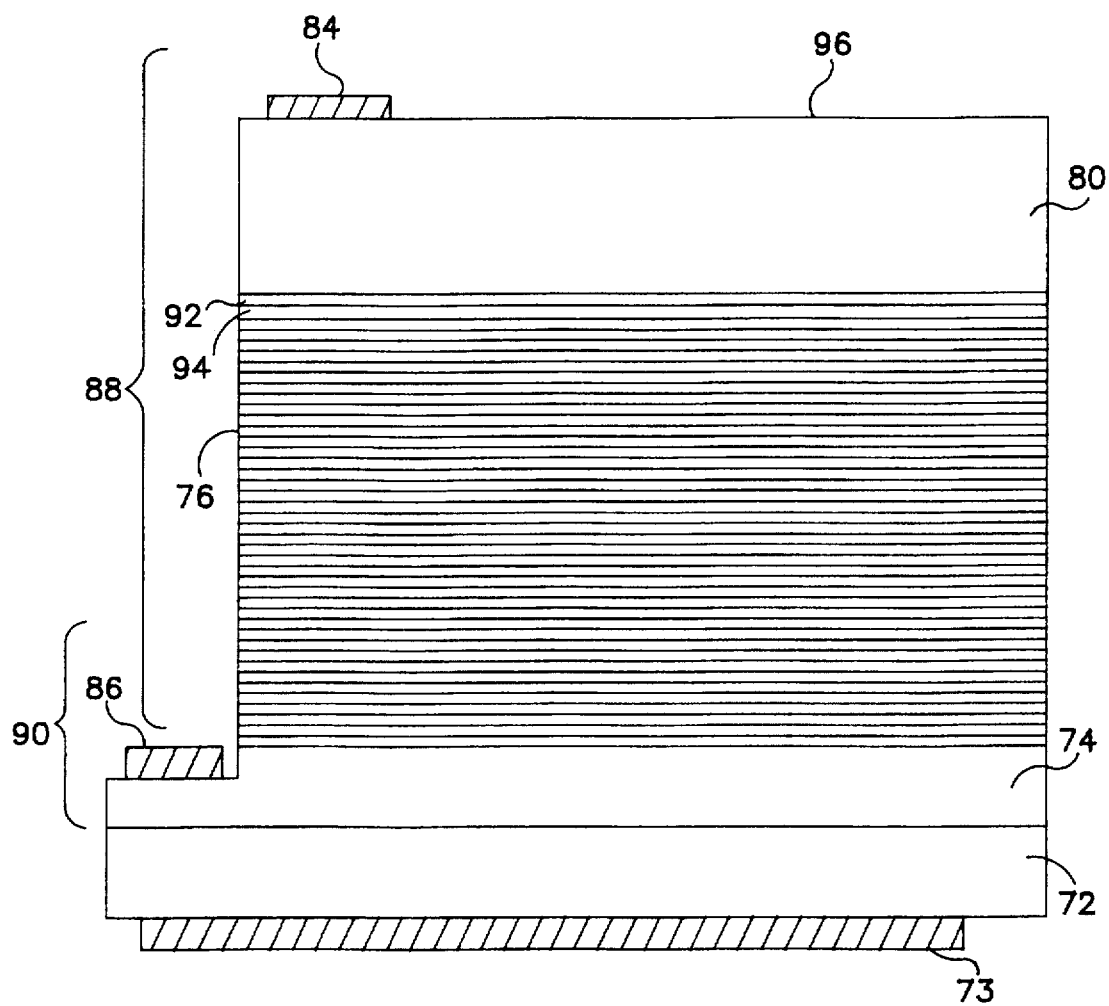
FIG. 7A depicts a schematic of a polarization sensitive detector according to an embodiment of the present invention.
Figure 7B:
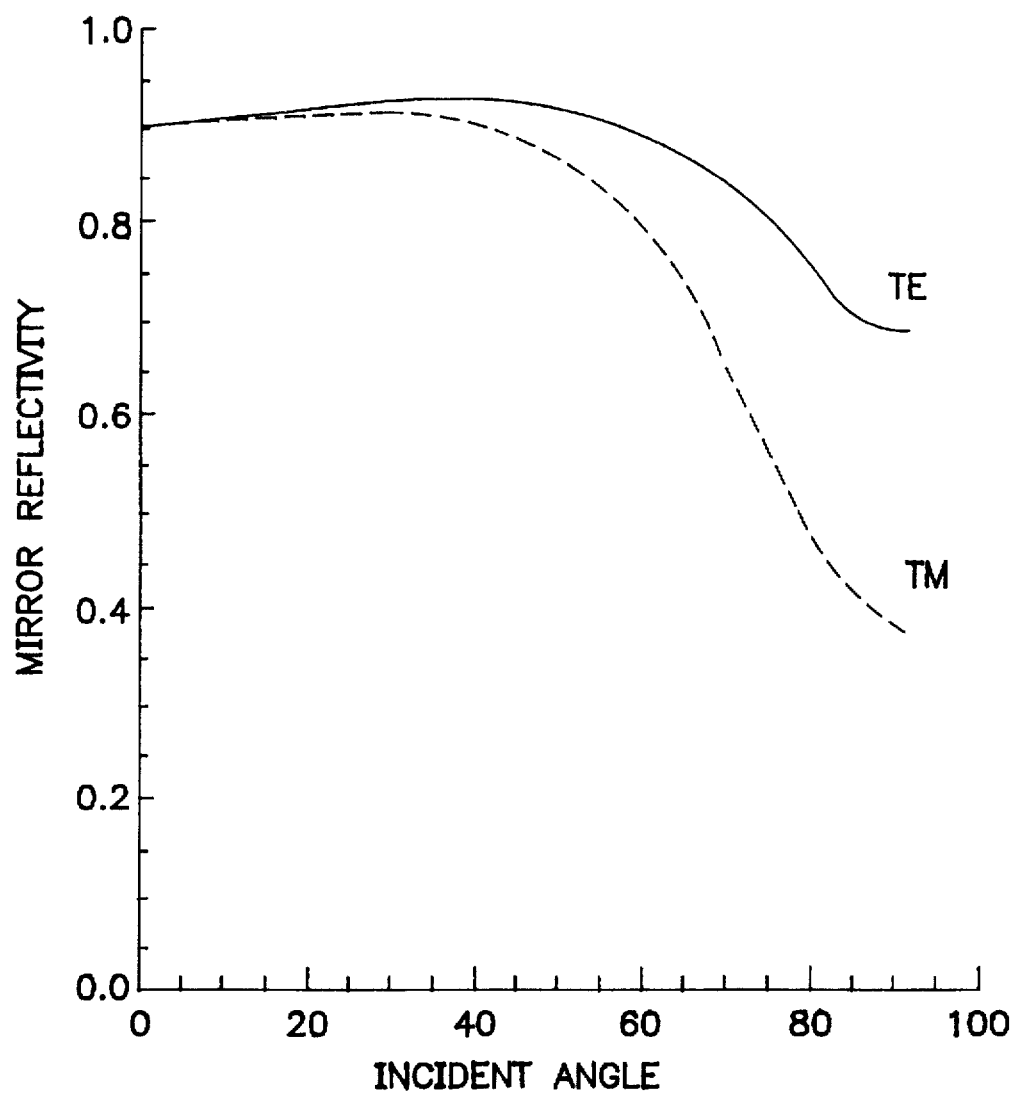
FIG. 7B is a graph depicting reflectivity versus incidence angle for both TE and TM polarized light according to an embodiment of the present invention.

FIG. 6 shows the incidence angle dependence of the surface reflectivity for GaAs/air interface $\lambda$=900 nm for TE and TM polarizations. Note that, at 74° incidence angle, TM-reflectivity vanishes (Brewster angle). For the same angle, TE-reflectivity is quite large. Similarly, a contrast in the bottom reflectivity can also be achieved. For example, in a preferred embodiment, as depicted in FIG. 7A, mirror structure 76 may comprise a 20 pair Al$_{0.5}$Ga$_{0.5}$As/AlAs DBR mirror. Mirror structure 76 may thus comprise alternating layers of a first layer 92 and a second layer 94, in this embodiment, first layer 92 comprising Al$_{0.5}$Ga$_{0.5}$As and second layer 94 comprising AlAs. Also, according to an embodiment of the present invention, a separating layer 78, a first absorption region 80, and a top layer 82 may instead comprise a single first absorption region 80 with absorption layer 80 and air forming the first reflector 96. FIG. 7B shows the angle dependence of TE (solid) and TM (dashed) reflectivities for a 20 pair Al$_{0.5}$Ga$_{0.5}$As/AlAs DBR mirror which provides the reflectively for second detector 90 and may be represented by R$_2$. In this embodiment, the refractive index of the AlAs is about 2.9, the refractive index of the GaAlAs is about 3.2 and the refractive index of the GaAs absorptive material is about 3.55. The wavelength of light used in FIG. 7B is about 900 with an initial incidence angle, $\theta_0$=30. As FIG. 7B illustrates, at larger incidence angles, a greater divergence of mirror reflectively occurs.

In this embodiment, because both the interface between top layer 82 and air, which forms a top reflector 96, and mirror structure 76 have a large contrast in reflectively at around Brewster angle, the amount of light captured in the top detector is a strong function of its polarization. Second detector 90 is disposed below mirror structure 76 and thereby its responsivity is proportional to the overall transmission of light through the top layers including the DBR mirror. Therefore, the polarization dependent reflectivity of mirror structure 76 results in a contrast in TE v. TM detection in second detector 90. Thereby, the structure is designed to capture as much TE light as possible in first detector 88, which is disposed on top, and transmit most of the TM light to second detector 90, which is disposed on bottom.

In other words, because top reflector 96 is polarization dependent, the resulting cavity for first detector 88 provides resonance enhancement for TE thus capturing the TE polarized light in first detector 88. For TM, both reflectivities of the top and bottom reflectors 96 and 76, respectively, are low and therefore, light is transmitted to the bottom detector. For a thin absorbing layer in the RCE detector, a large contrast in TE/TM response of first and second detectors 88 and 90 is achieved and the linear polarization may be computed from their relative responses using a circuit as depicted in FIG. 4, for example.

The contrast in the TE/TM reflectivity of the bottom DBR mirror is relatively small for a AlAs/AlGaAs structure because the incident beam is strongly refracted due to the large refractive index ($\eta$=2.9 for AlAs). The beam inside the semiconductor is therefore always at a small angle with the normal resulting in a small difference in reflectivities at the AlAs/GaAs interfaces. The DBR reflectivity contrast may be improved significantly if smaller refractive index materials are used to construct the multi-layer structure. For the GaAs material system, the use of native oxide mirrors (with $\eta$ as small as 1.7) may be used as an alternative.

The detector responses $D_1$ and $D_2$, of first and second detectors 88 and 90, respectively, may be expressed by Eqns. 3–5 given above.

Figure 8:
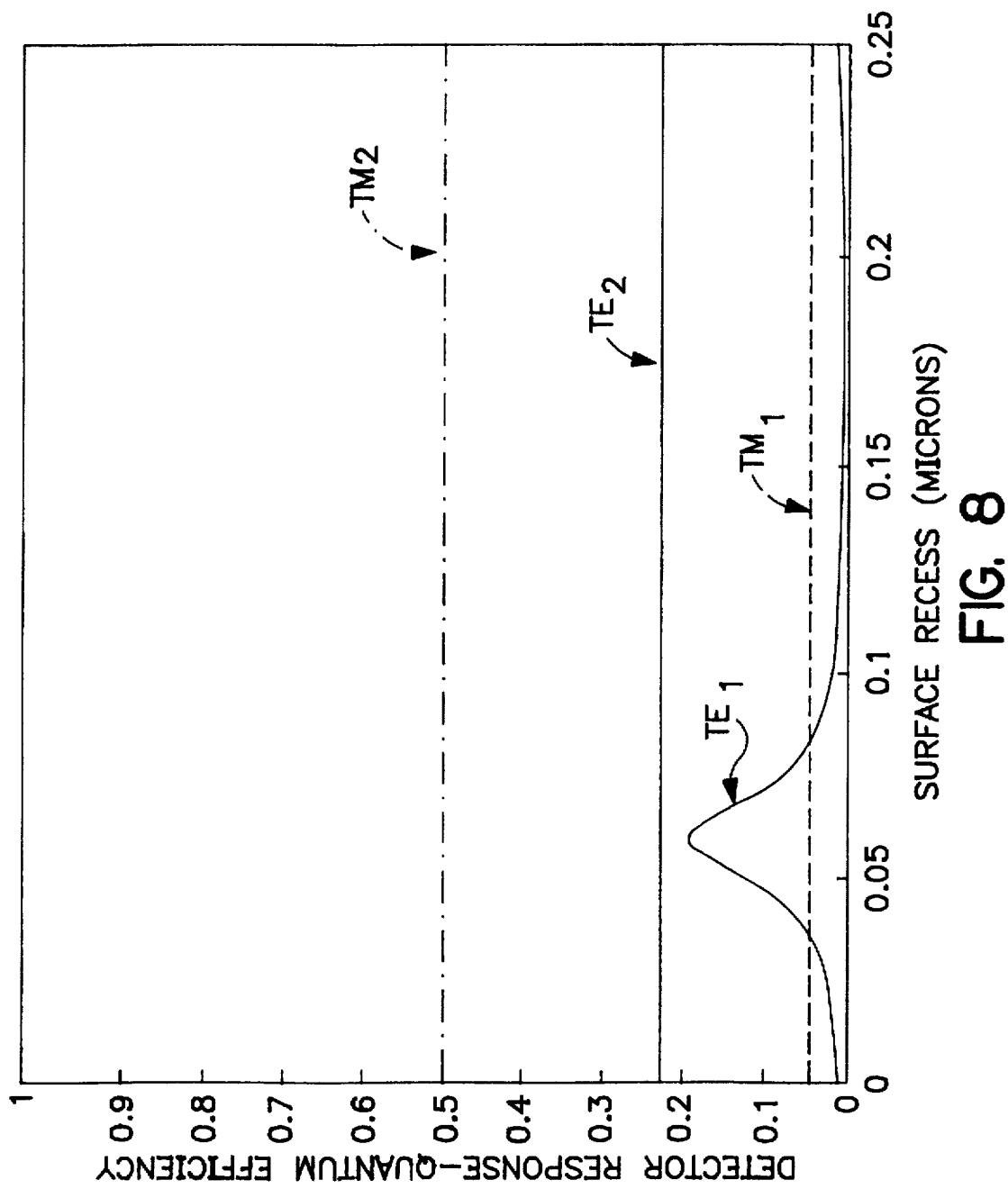
FIG. 8 is a graph illustrating detector response versus surface recess for an embodiment of the present invention.

To calculate the elements of the [S] matrix, we use the reflectivities for top ($R_1$) and bottom ($R_2$) mirrors for given material combinations. For the GaAs/AlGaAs structure, $R_1$ is given by FIG. 6 and $R_2$ is shown in FIG. 7B for a specific DBR design as indicated. FIG. 8 shows the estimated quantum efficiencies for TE and TM in first and second detectors 88 and 90. At resonance (peak of $TE_1$) a significant contrast for the two detectors can be obtained. For this case $$\begin{bmatrix} S_{1,TE} & S_{1,TM} \\ S_{2,TE} & S_{2,TM} \end{bmatrix} = \begin{bmatrix} 0.19 & 0.04 \\ 0.24 & 0.50 \end{bmatrix} \quad (9)$$

According to another embodiment, an improved structure may be provided by using a different material system with smaller refractive indices. For example, Si material systems using dielectric DBR mirrors offer more drastic enhancement in TE/TM contrast for even fewer periods of the DBR mirror. As an added advantage, an Si/SiO$_2$/Si$_3$N$_4$ material system offers monolithic integration of the polarization detectors with vertical cavity polarization detection circuitry implementing smart pixels and arrays for polarization sensing and imaging. These structures may be formed on Si VLSI circuits by depositing dielectric films for DBR mirrors and using SOI (silicon on insulator) for the top absorption layer in the RCE detector. The VLSI circuit may be accessed by mesa processing of the detector structure and detectors may be integrated with electronic devices for processing the two detector outputs to compute the incident polarization.

For example, FIG. 15 depicts an embodiment of a monolithic VLSI circuit according to the present invention. FIG. 15 comprises two detectors 88 and 90 formed on a substrate 72. First and second electrical contact devices 84 and 86 are connected to the VLSI circuit using layer 95. Layer 91 may comprise a dielectric film used to provide electrical isolation of layer 95 and photodetectors 88 and 90. The detectors may also be connected to other electrical on-chip components 93. Other electrical on-chip components 93 may comprise a microprocessor, for example. In this embodiment, the microprocessor may be used to calibrate the operation of the detectors in connection with external devices.

Figure 9A:
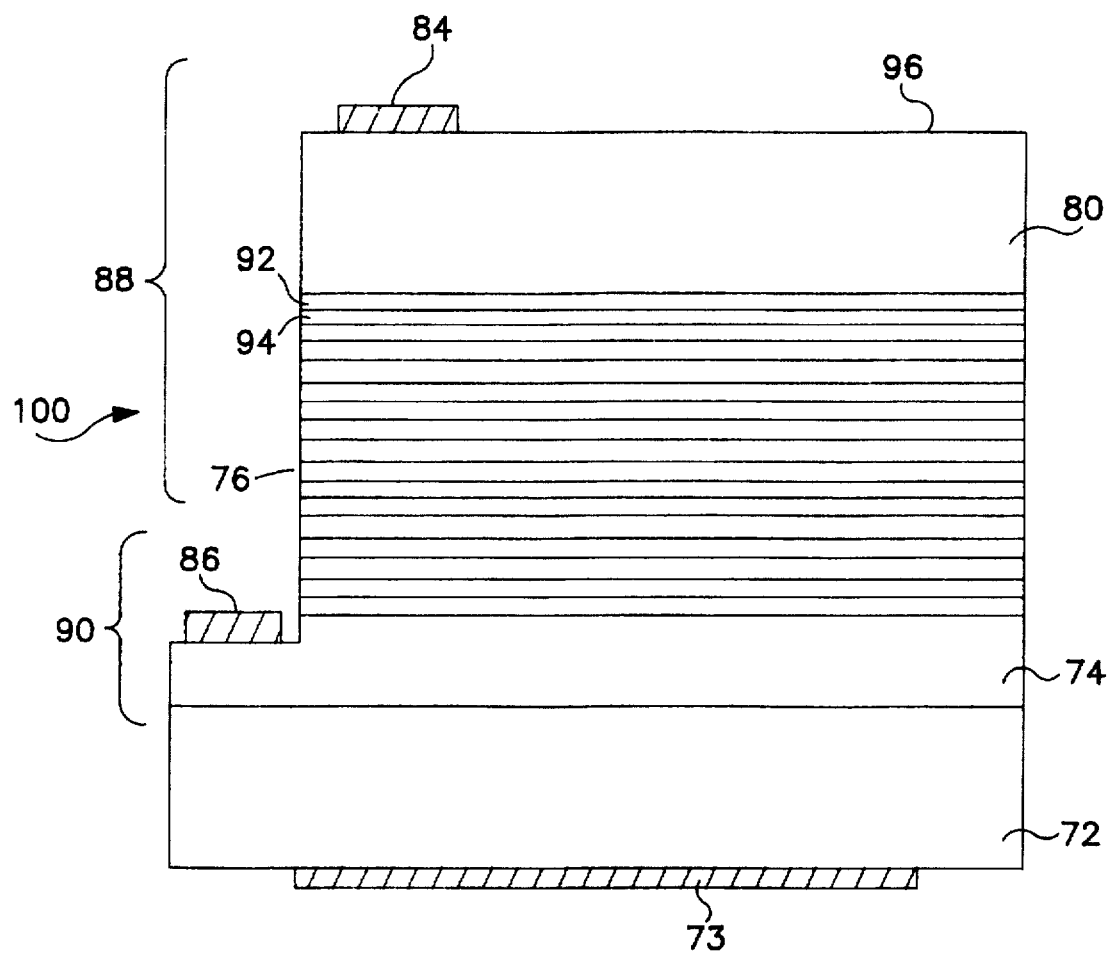
FIG. 9A depicts a schematic of a polarization sensitive detector according to an embodiment of the present invention.
Figure 9B:
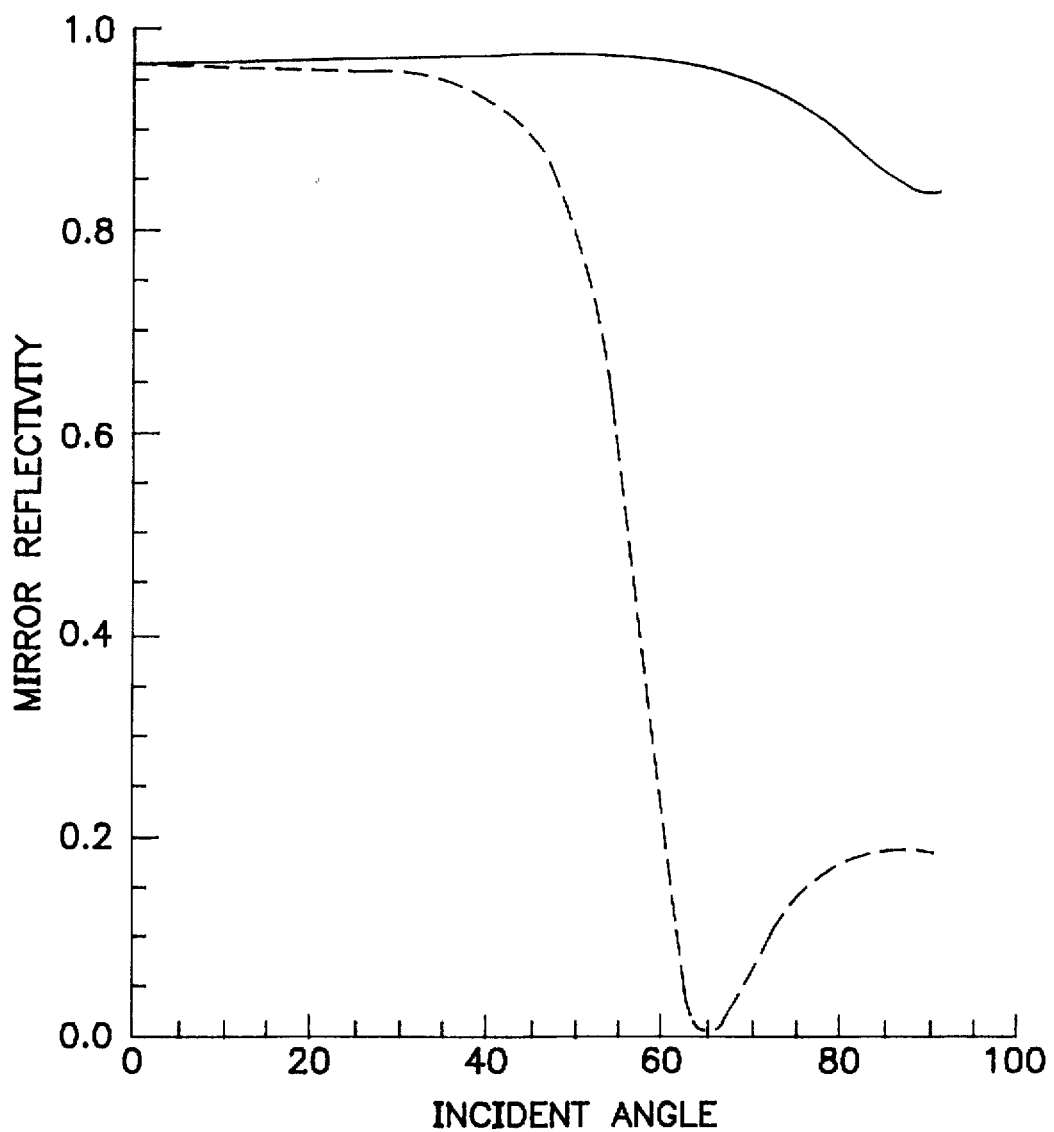
FIG. 9B is a graph depicting reflectivity versus incidence angle for both TE and TM polarized light according to an embodiment of the present invention.
Figure 10:
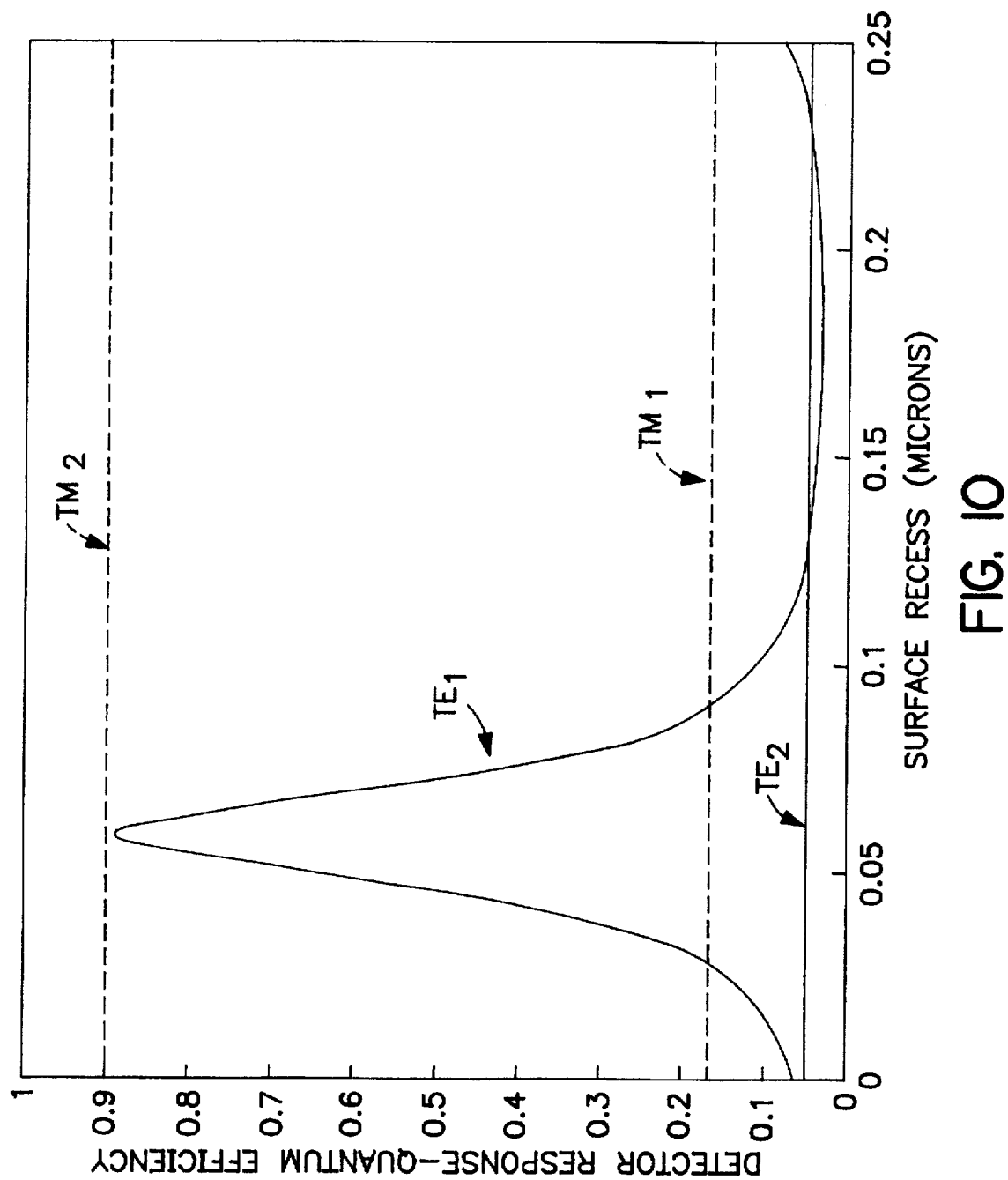
FIG. 10 is a graph illustrating detector response versus surface recess for an embodiment of the present invention.

As another example of a photodetector using Si/SiO$_2$/Si$_3$N$_4$, a photodetector 100 may be provided with a mirror structure 76 comprising an 8 pair DBR mirror consisting of SiO$_2$ and Si$_3$N$_4$, as depicted in FIG. 9A. First layer 92 comprises SiO$_2$ and second layer 94 comprises Si$_3$N$_4$ In this embodiment, FIG. 9B shows the TE and TM reflectivities for an 8 pair DBR mirror comprising layers of SiO$_2$ and Si$_3$N$_4$. In this embodiment, the refractive index of SiO$_2$ is about 1.45, the refractive index of Si$_3$N$_4$ is about 2.05 and the refractive index of the absorptive layer 80 which is Si, is about 3.1. Absorptive layer 80 may comprise Si and may have a thickness of about 1.5 microns. The light measured in FIG. 9B had a wavelength of about 900 nm and an initial incidence angle, $\theta_0$=30. At around the Brewster angle of Si/air interface (about 72°), a very large contrast for $R_2$ may be achieved. Therefore, the quantum efficiency for TE and TM for first and second detectors 88 and 90 is very different, as illustrated in FIG. 10. The TE and TM values for both first and second detectors 88 and 90 are indicated by the subscript 1 and 2, respectively. [S] matrix becomes:

$$\begin{bmatrix} S_{1,TE} & S_{1,TM} \\ S_{2,TE} & S_{2,TM} \end{bmatrix} = \begin{bmatrix} 0.88 & 0.18 \\ 0.90 & 0.04 \end{bmatrix} \quad (10)$$

Figure 11A:
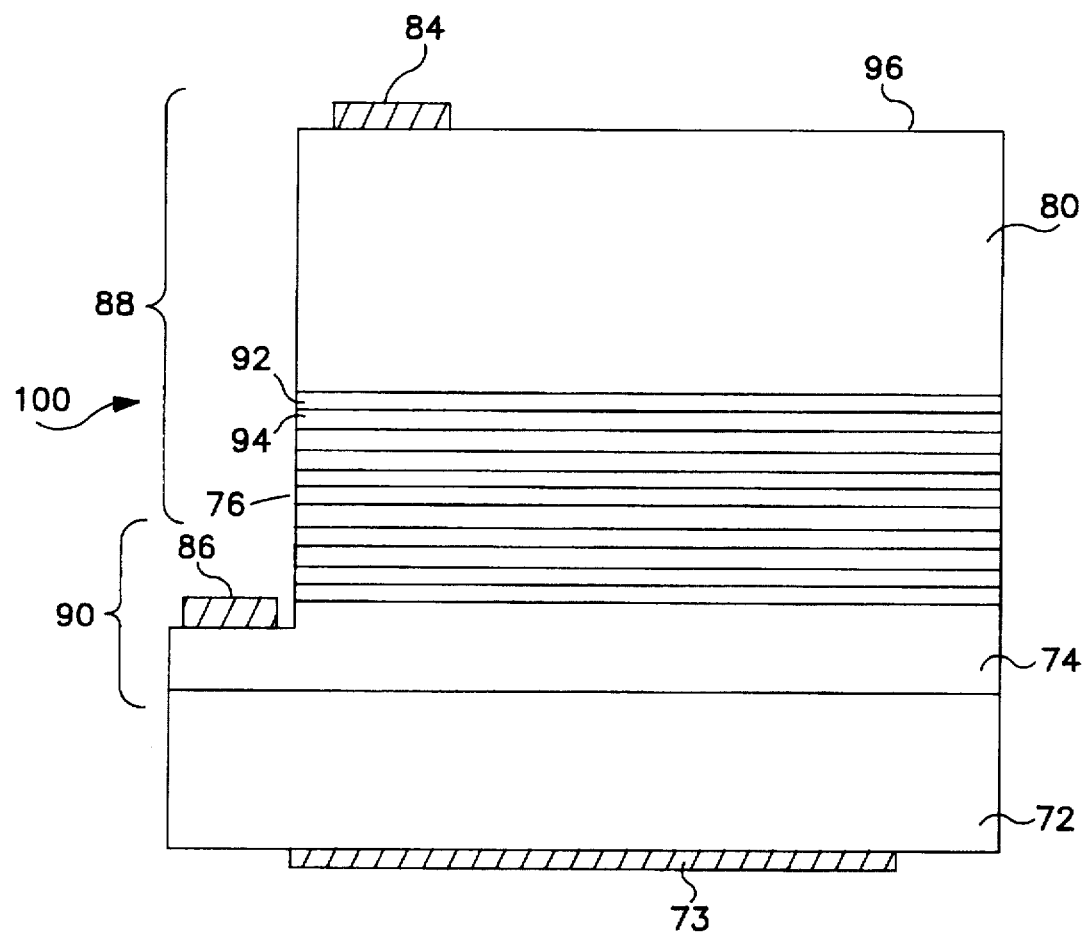
FIG. 11A depicts a schematic of a polarization sensitive detector according to an embodiment of the present invention.
Figure 11B:
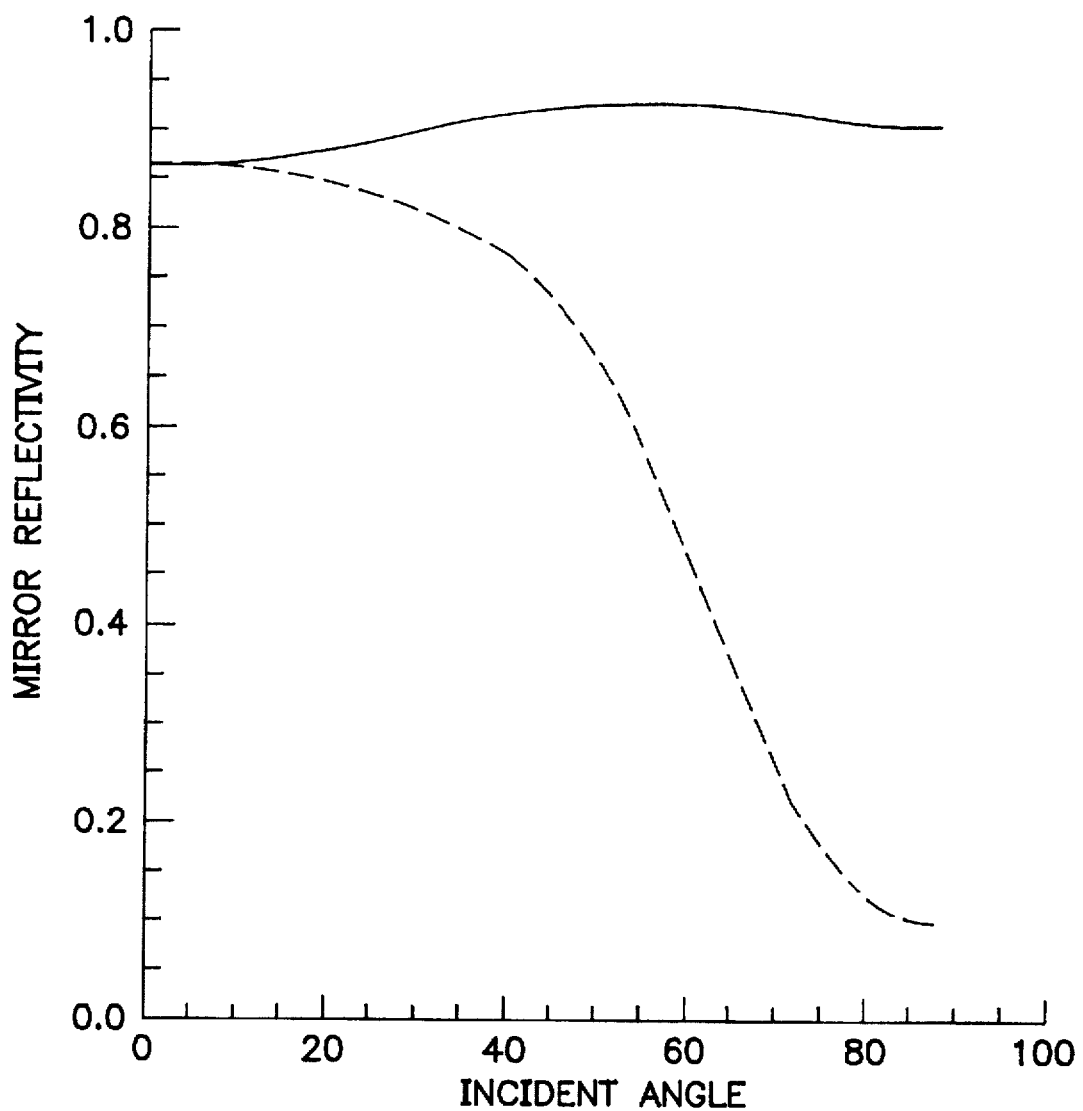
FIG. 11B is a graph depicting reflectivity versus incidence angle for both TE and TM polarized light according to an embodiment of the present invention.
Figure 12:
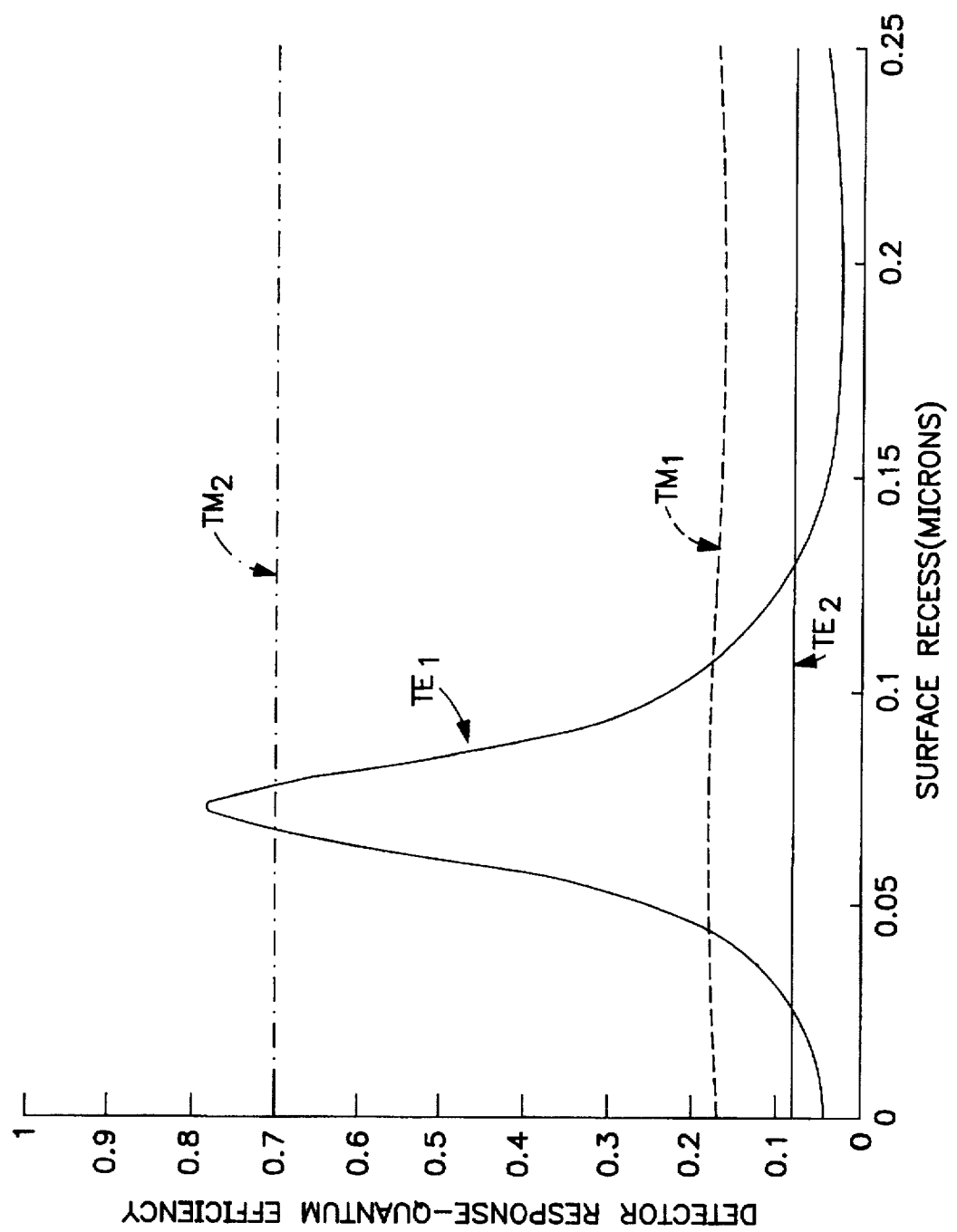
FIG. 12 is a graph illustrating detector response versus surface recess for an embodiment of the present invention.

According to another embodiment, an improved structure may be provided by using a different material system with smaller refractive indices. For example, a photodetector 100 may be provided with a mirror structure 76 comprising a 5 pair DBR mirror consisting of SiO$_2$ and Si$_3$N$_4$, as depicted in FIG. 11A. First layer 92 comprises SiO$_2$ and second layer 94 comprises Si$_3$N$_4$ In this embodiment, FIG. 11B shows the TE and TM reflectivities for a 5 pair DBR mirror comprising layers of SiO$_2$ and Si$_3$N$_4$. In this embodiment, the refractive index of SiO$_2$ is about 1.45, the refractive index of Si$_3$N$_4$ is about 2.05 and the refractive index of absorptive layer 80 (Si) is about 3.1. The light measured in FIG. 11B had a wavelength of about 900 nm and an initial incidence angle, $\theta_0$=30. Therefore, the quantum efficiency for TE and TM for first and second detectors 88 and 90 is very different, as illustrated in FIG. 12. The TE and TM values for both first and second detectors 88 and 90 are indicated by the subscript 1 and 2, respectively.

In the embodiments of FIGS. 5, 7A, 9A, and 11A, the alignment of the incident beam is not critical. Because first and second detectors 88 and 90 are vertically integrated, the spatial distribution of incident radiation does not affect the accuracy of polarization measurement. Therefore, the light beam may be smaller than the detector area allowing for capturing all of the light in the detector. The incident light may be focused onto the top surface of the photodetector using a large incidence angle. Therefore, the beam shape of the light may be spread out in one dimension. For highest efficiency, the surface area of the device matches the beam shape. Consequently, because of the incidence angle and the creation of a beam shape being larger in one dimension, the detector surface may likewise be larger in one dimension to maximize detector efficiency. Also, because the devices work under spatially varying light intensities, imaging array detectors that can register the polarization distribution in addition to the intensity of light are realized according to the present invention without requiring any beam splitters and/or polarization filters.

Figure 14:
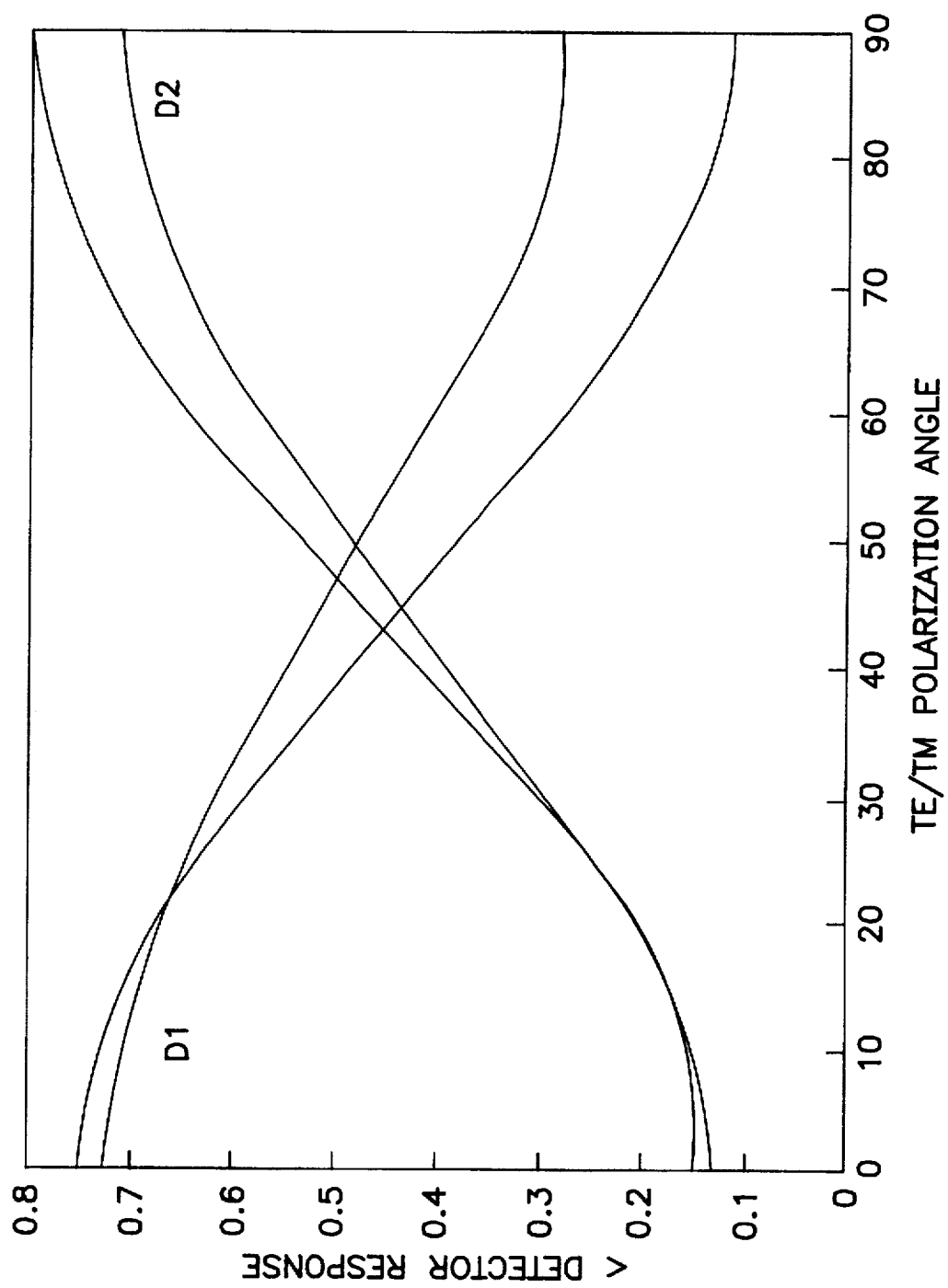
FIG. 14 is a graph illustrating detector currents at different incidence angles on a device according to an embodiment of the present invention.

For each of the embodiments of the present application, detector response currents, $D_1$ and $D_2$, may be expressed by Eqns. 3 and 4. FIG. 14 depicts a graph illustrating the detector currents at two different incidence angles as a function of polarization. In FIG. 14, the solid lines represent $D_1$ and $D_2$ at Brewster's angle and the dashed lines represent $D_1$ and $D_2$ at an angle of about 60 degrees. The cavity length of the RCE device is optimized separately for different incidence angle cases. The increase in the total variation of detector response ratios observed at smaller incidence angles indicates improving polarization resolution. This improvement is accomplished by reduction in the linearity of the response.

Figure 17:
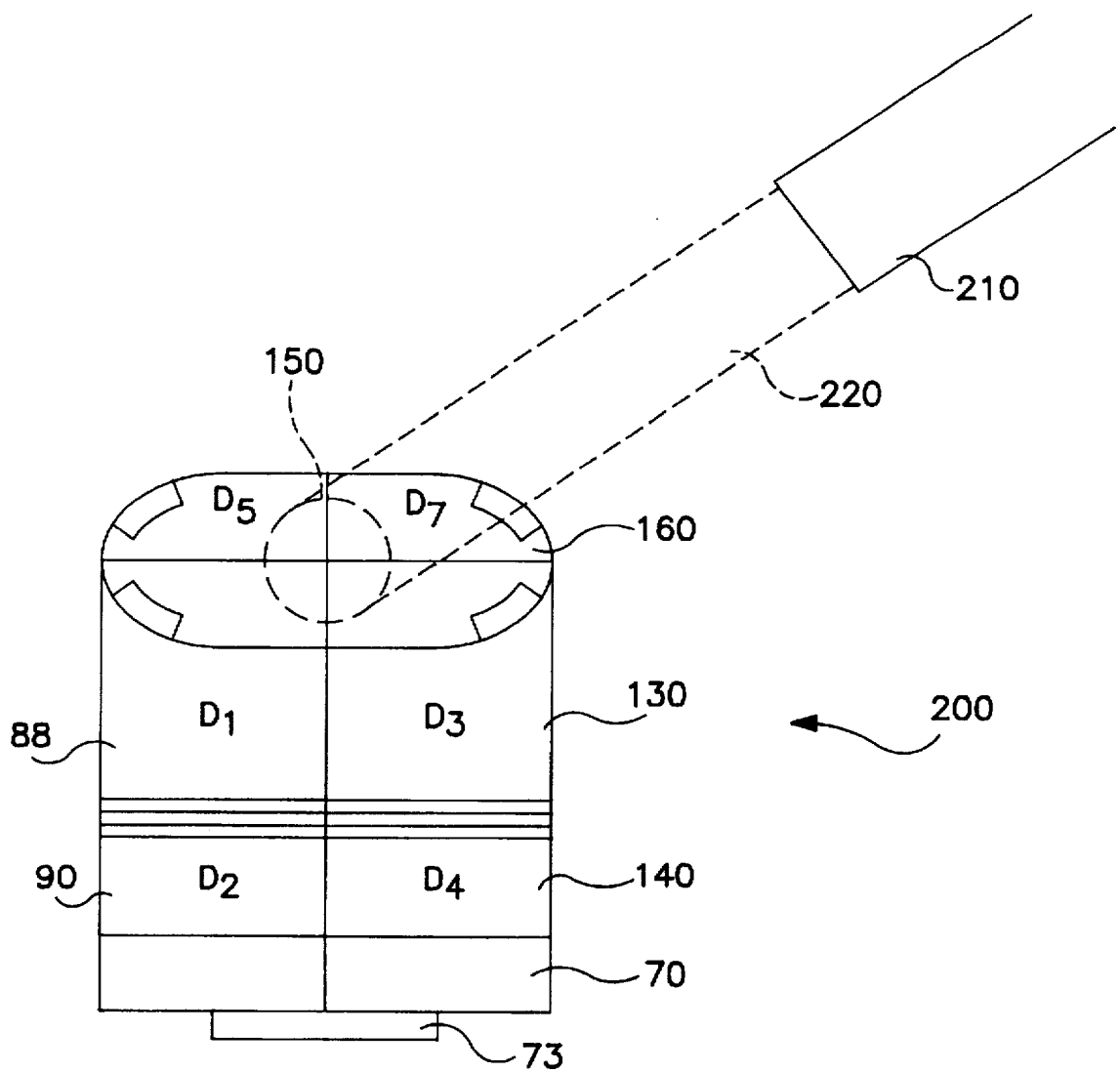
FIG. 17 depicts a quadrant detector according to an embodiment of the present invention.

According to another embodiment of the present invention, a quadrant detector may be provided. According to this embodiment, polarization and positioning sensing may be detected simultaneously. FIG. 17 depicts a quadrant detector according to an embodiment of the present invention. FIG. 17 comprises a substrate 70 with four pairs of detectors vertically aligned on the substrate 70. Monolithic horizontally arranged detectors may also be used. According to this embodiment, quadrant device 200 comprises first detector 88 and second detector 90, which may be vertically aligned. Quadrant device 200 also comprises a third detector 130 and fourth detector 140 which may be vertically aligned. Quadrant device 200 also comprises a fifth detector 150 and a sixth detector (not shown) which may be vertically aligned and a seventh detector 160 and an eighth detector (not shown) which may be vertically aligned. Also, each of the pairs may be separate within the quadrant according to the embodiment of FIG. 1, for example.

A light source 210 may be provided for directing a light beam 220 at quadrant detector 200. In this arrangement, first, third, fifth and seventh detectors 88, 130, 150, and 160, respectively, may be used to detect whether light source 210 is properly positioned in a predetermined desired position. For example, in a magneto-optical drive, the laser source may be positioned such that light is to be evenly distributed across the four top detectors. The position of even distribution may be the predetermined desired position, for example. If the output from each of the detectors is not equal, then quadrant detector 200 detects that light source 210 is out of position and may cooperate with other circuitry and/or devices to move light source 210 back into the predetermined desired position.

At the same time, however, each of the vertically aligned pairs may be simultaneously used for polarization detection. In this arrangement, any one of the four pairs may be used for the output, or, some combination of the four outputs may be used to avoid errors. For example, a normalization scheme may be employed which uses all four detector pair outputs to generate one polarization output to ensure accuracy in operation of the system.

Figure 18:
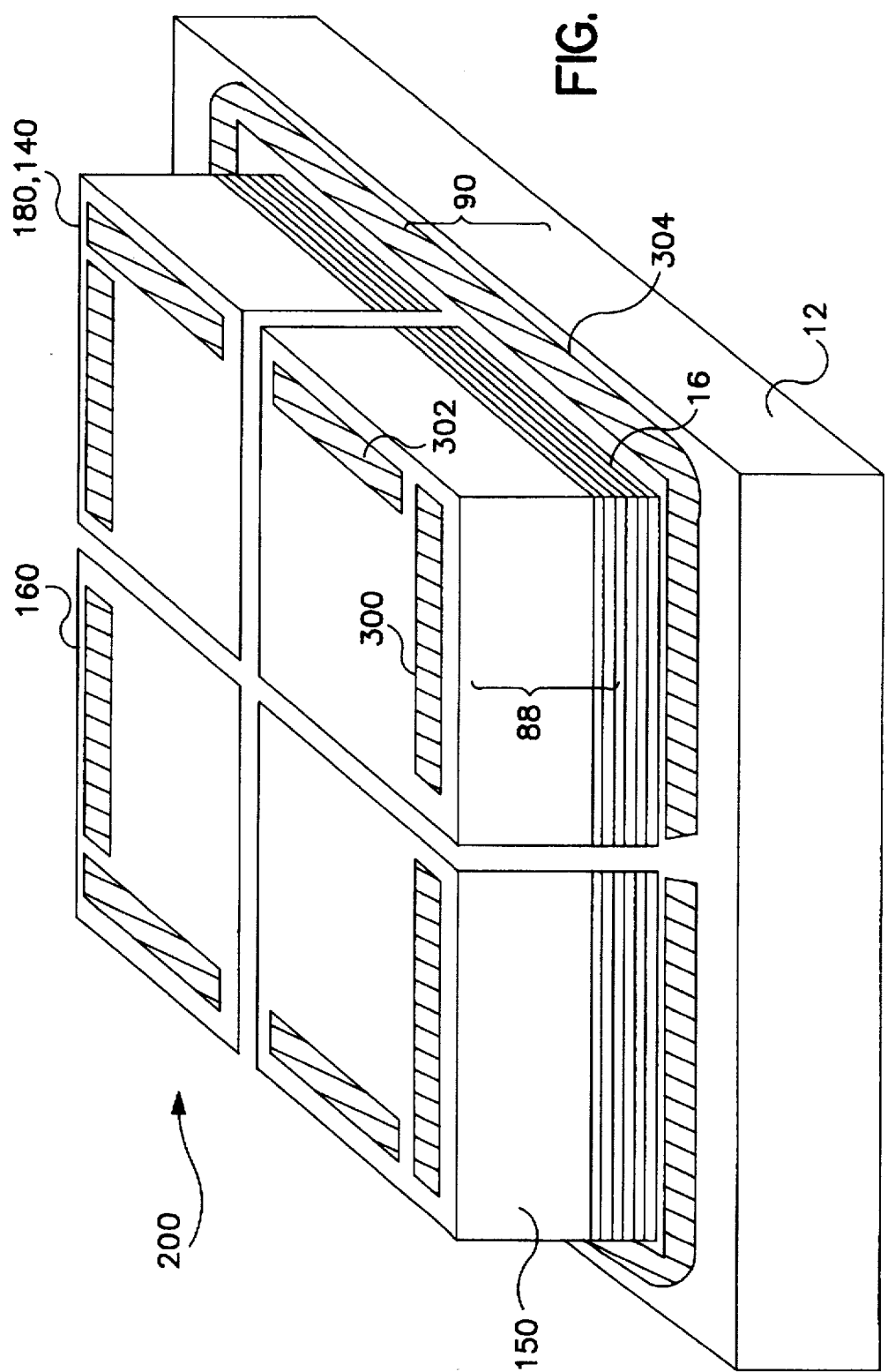
FIG. 18 depicts a quadrant detector according to an embodiment of the present invention.

FIG. 18 depicts another embodiment of a quadrant detector 200 according to the present invention. Each quadrant comprises a vertically stacked pair of detectors. Each pair of detectors comprises a first electrical contact device 300 and a second electrical contact device 302. Further, each detector pair shares a third electrical contact device 304. According to this embodiment, each detector may be rectangular. A mesa shaped embodiment as in FIG. 17 may also be used.

The devices described according to several embodiments of the present invention may be used in a number of applications. According to one embodiment of the present invention, an erasable optical data storage using magneto-optical media may be provided. Erasable optical data storage using magneto-optical media rely on the state of polarization of the read beam to detect the data. Current technology uses a polarizing beam splitter (cube or plate) to separate the TM and TE component of polarization and direct them to separate diode detectors.

Figure 16A:
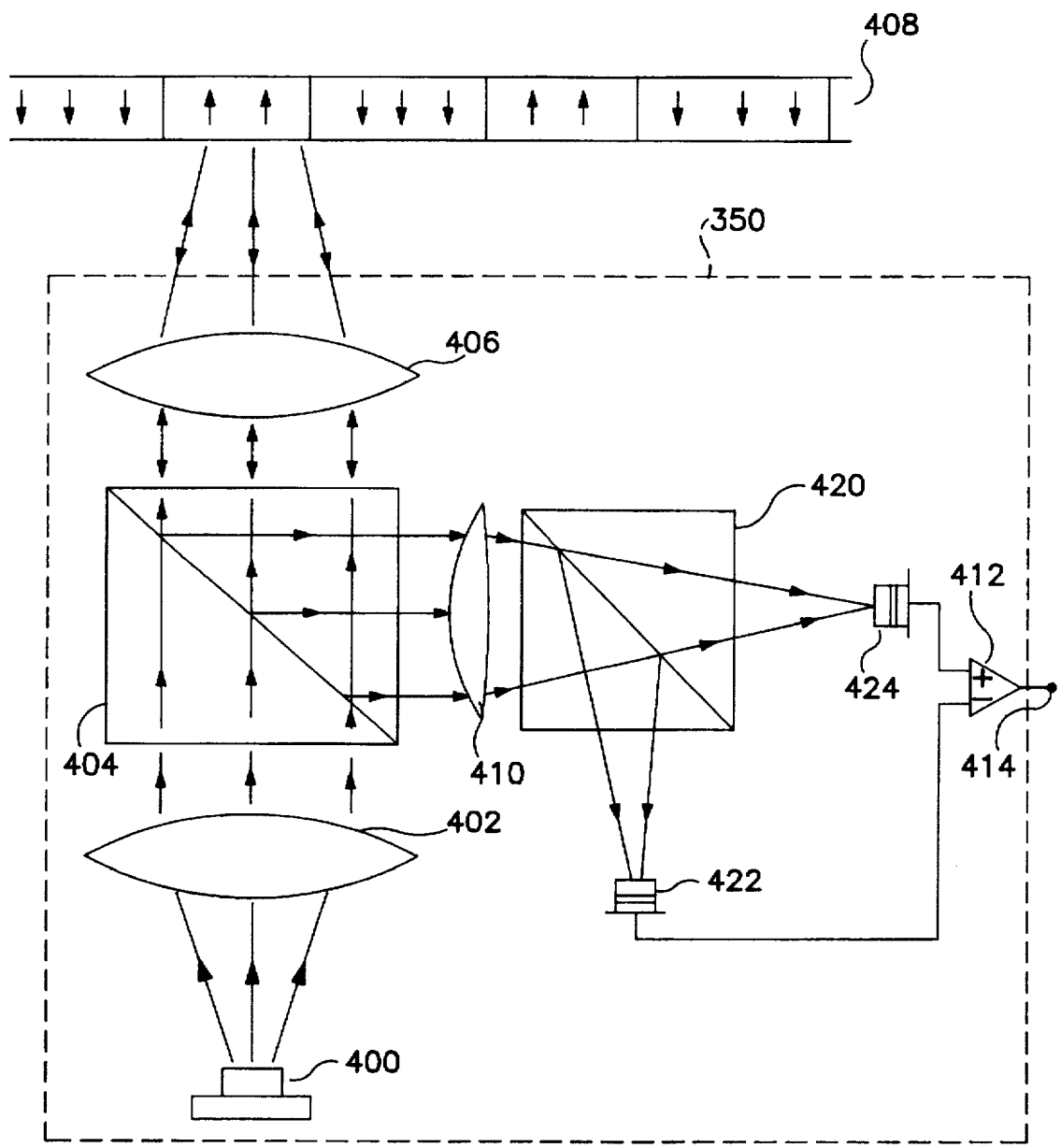
FIG. 16A depicts a magneto-optical data storage drive using conventional photodetectors.

For example, FIG. 16A depicts a magneto-optical data storage drive using conventional photodetectors. A magneto-optical drive 800 operates to read information stored on an optical disk drive 408. Magneto-optical drive 800 comprises a light source 400, a first lens 402, a beam splitter mechanism 404, a first focusing lens 406, a second focusing lens 410, a polarizing beam splitter mechanism 420, two photodetectors 424 and 422, and a comparator circuit 412. Photodetectors 424 and 422 may comprise conventional photodetectors. Magneto-optical drive 500 provides an output 414 representing data read from optical disk device 408. In this apparatus, polarization sensing is performed by the polarizing beam splitter mechanism 420 and photodetectors 422 and 424. The light coming from beam splitter 404 is focused via second focusing lens 410. The polarization beam splitter mechanism 420 separates the light such that one polarization is reflected and absorbed by photodetector 422 and the other polarization is transmitted and absorbed by photodetector 424. The comparator 412 compares the outputs from photodetectors 422 and 424 and thus provides an output indicating a change in polarization of the light which signals a change from a zero to a one or vise versa. The apparatuses, for example, the device of FIG. 16A, which employ a separate polarizing beam splitter, suffer from weight and manufacturing problems. The weight makes the optical head slower and reduces data transfer times. Manufacturing with three components adds complexity and creates demanding tolerances. Any progress towards an integral polarization detector that provides a polarization difference readout while reducing weight and parts count would be welcomed by the data storage industry. Cost is also a problem with the present erasable optical data storage devices because polarizing cube beam splitters are expensive.

A photodetector array according to the present invention may be used to detect data by sensing the polarization of the read beam. As such, there is no need for a beam splitter and thus a significant reduction in cost may be achieved. Additionally, the optical and electrical properties of silicon allow for fabrication of polarization detectors in visible to near -IR wavelength range. Therefore, for magneto-optic data storage applications, the capability of fabricating polarization sensors in the visible spectrum is particularly important since the storage capacity scales inversely with the wavelength.

Figure 16B:
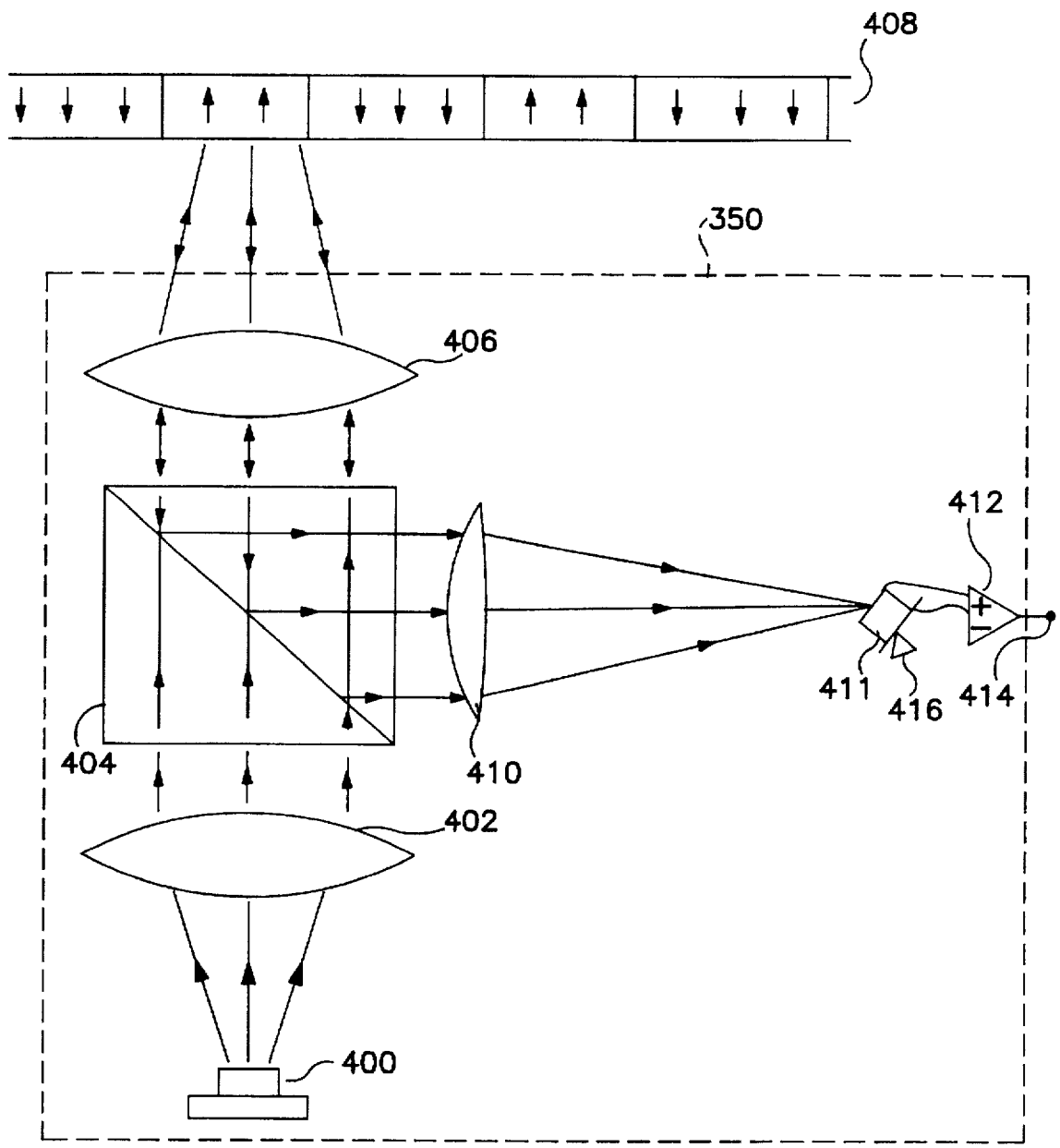
FIG. 16B depicts an embodiment of a magneto-optical data storage drive according to an embodiment of the present invention.

For example, FIG. 16B depicts an embodiment of a magneto-optical data storage drive according to the present invention. A magneto-optical drive 350 operates to read information stored on an optical disk device 408. Magneto-optical drive 350 comprises a light source 400, a first lens 402, a beam splitter mechanism 404, a first focusing lens 406, a second focusing lens 410, a detector 411, and a comparator circuit 412. Magneto-optical drive 350 provides an output 414 representing data read from optical disk device 408. Light source 400 may preferably comprise a laser such as a GaAs laser, for example. Other laser sources or light sources may also be used. First lens 402 serves to direct the output of light source 400 through beam splitter mechanism 404. Beam splitter mechanism 404 directs light from light source 400 toward first focusing lens 406 and at the same time directs light coming through first focusing lens 406 toward second focusing lens 410. Beam splitter assemblies for serving this purpose are known. Any beam splitter which performs this function may be used. Light passing through beam splitter mechanism 404 is directed by first focusing lens 406 toward optical disk device 408.

The light directed at optical disk device 408 is reflected in a polarization depending on the surface of the optical disk device 408. In other words, optical disk device 408 reflects the stored data in terms of a change in polarization as optical disk device 408 rotates, and indicates a change from a one to a zero or vise versa. Therefore, by detecting the polarization of light reflected from optical disk device 408, the magneto-optical drive 350 may read the data stored on optical disk device 408. Operation of magneto-optical drives is known in the art.

The present invention provides the advantage of having a polarization detector 411 according to the present invention without requiring a second polarization beam splitter mechanism, for example polarizing beam splitter mechanism 420 of FIG. 16A. Thereby, the weight, size, and cost of the system may be significantly reduced. Polarization detector 411 may comprise an embodiment of polarization detector according to the present invention. For example, polarization detector may comprise a polarization detector 10, 70, 100, or 200. Other embodiments of polarization detectors according to the present invention may also be used.

As described above, a comparator circuit 414 may be provided for generating a polarization output 414 indicating either the polarization ratio or a change in polarization. According the present invention may provide a magneto-optical drive without requiring two beam splitters. Therefore, a smaller and more compact drive device may be provided.

Additionally, according to another embodiment of the present invention polarization detector 411 may be connected to a computer. In one embodiment, the computer may comprise a microprocessor and memory and may be provided on the same chip as the polarization detector. Additionally, a calibration control mechanism 416 may be provided on polarization detector 411. In this embodiment, the operation of the magneto-optical drive may be calibrated. For example, an optical disk having a known sequence of values may be used. Magneto-optical drive device 350 may then be operated to read the known optical disk sequence. If the detected value differs from the known value, calibration control mechanism 416 may be operated to adjust the angle of incidence of light onto polarization detector 411. Also, the entire magneto-optical drive device 350 may be adjusted to reposition the device in relation to optical disk device 408. This process may be repeated until the incidence angle of the polarization detector 411 and positioning of magneto-optical drive device 350 are calibrated. Calibration may be necessary over time due to physical disruption of the device or due to any other change in the arrangement of components in the magneto-optical drive device 350.

According to another embodiment of the present invention, polarization multiplexing may be provided for increasing the capacity of optical transmission by a factor of two. By using the low cost polarization sensitive detectors according to the present invention, polarization multiplexing may be achieved which may be used to increase the capacity of undersea fiber cables, for example. The proposed devices can be employed as fast, reliable detectors in any polarization multiplexing system.

According to another embodiment of the present invention, the present photodetector structures may be used in polarization sensing arrays. Imaging array detectors which are sensitive to polarization may be used in remote sensing, especially for naval applications and medical imaging, for example.

Figure 19:
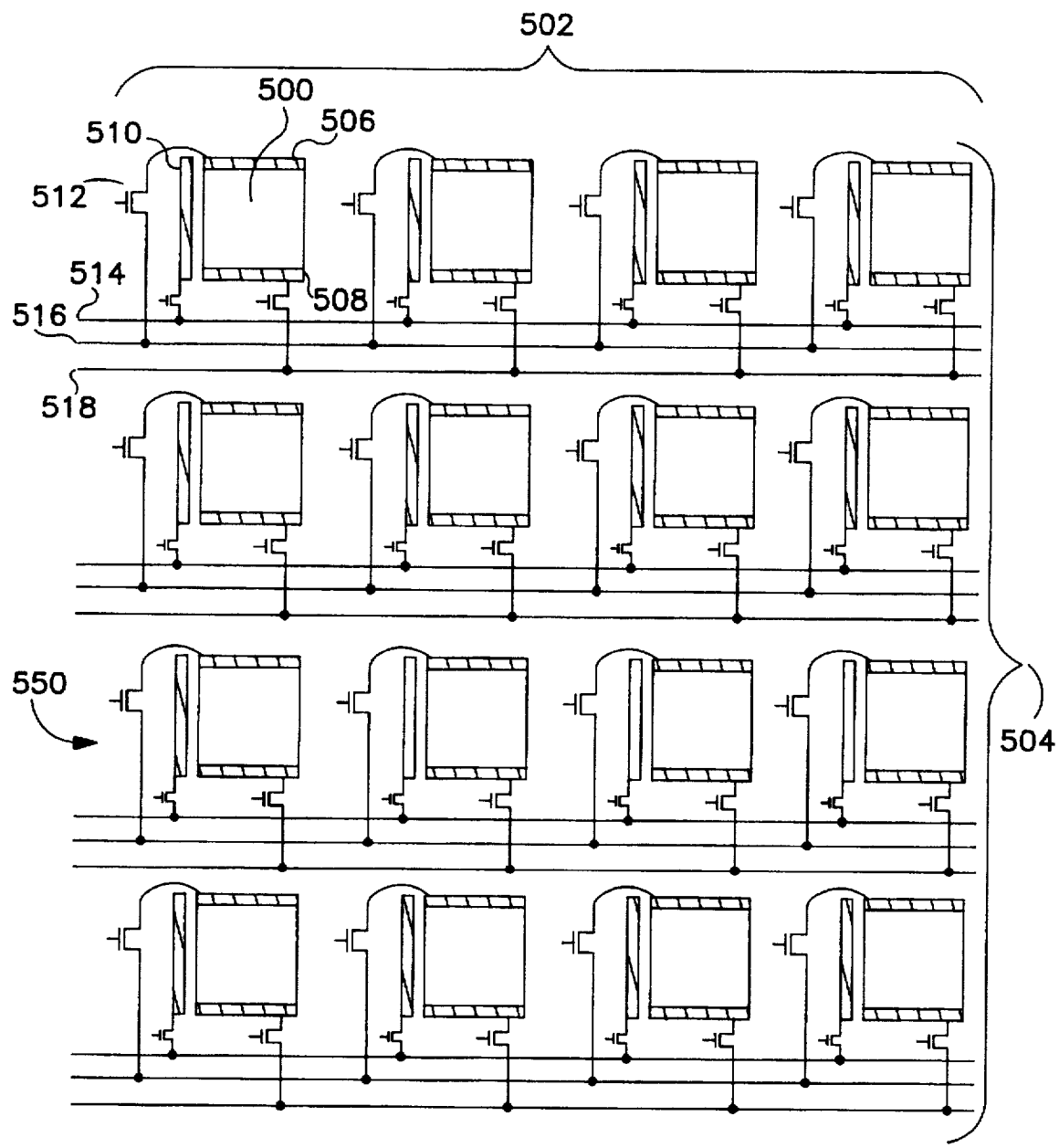
FIG. 19 depicts a CCD array according to an embodiment of the present invention.

FIG. 19 depicts a polarization CCD array according to an embodiment of the present invention. CCD array 550 comprises a plurality of polarization detectors 500 arranged into a plurality of columns 502 and rows 504. Each column and row may comprise a plurality of polarization detectors 500, such as four, for example. A larger number of polarization detectors 500 may be provided. Each polarization detector 500 may comprise a p-contact 506, an n-contact 508 and a substrate detector contact 510. Each contact may be connected to a bus via a MOS transistor 512, for example. Substrate detector contact 510 is connected to a substrate contact bus 514, p-contact 506 may be connected to a p-bus 516, and n-contact 508 may be connected to an n-bus 518. Each of the buses may be connected to circuitry for providing outputs from each of the polarization detectors such that a polarization array is generated. A computer or other processing device may be connected to the buses and circuitry for generating information indicative of the polarization of images which are detected by the CCD array 550. In such an arrangement, polarization imaging may be provided into a single chip device because beam splitters are not necessary for polarization sensing.

Figure 20:
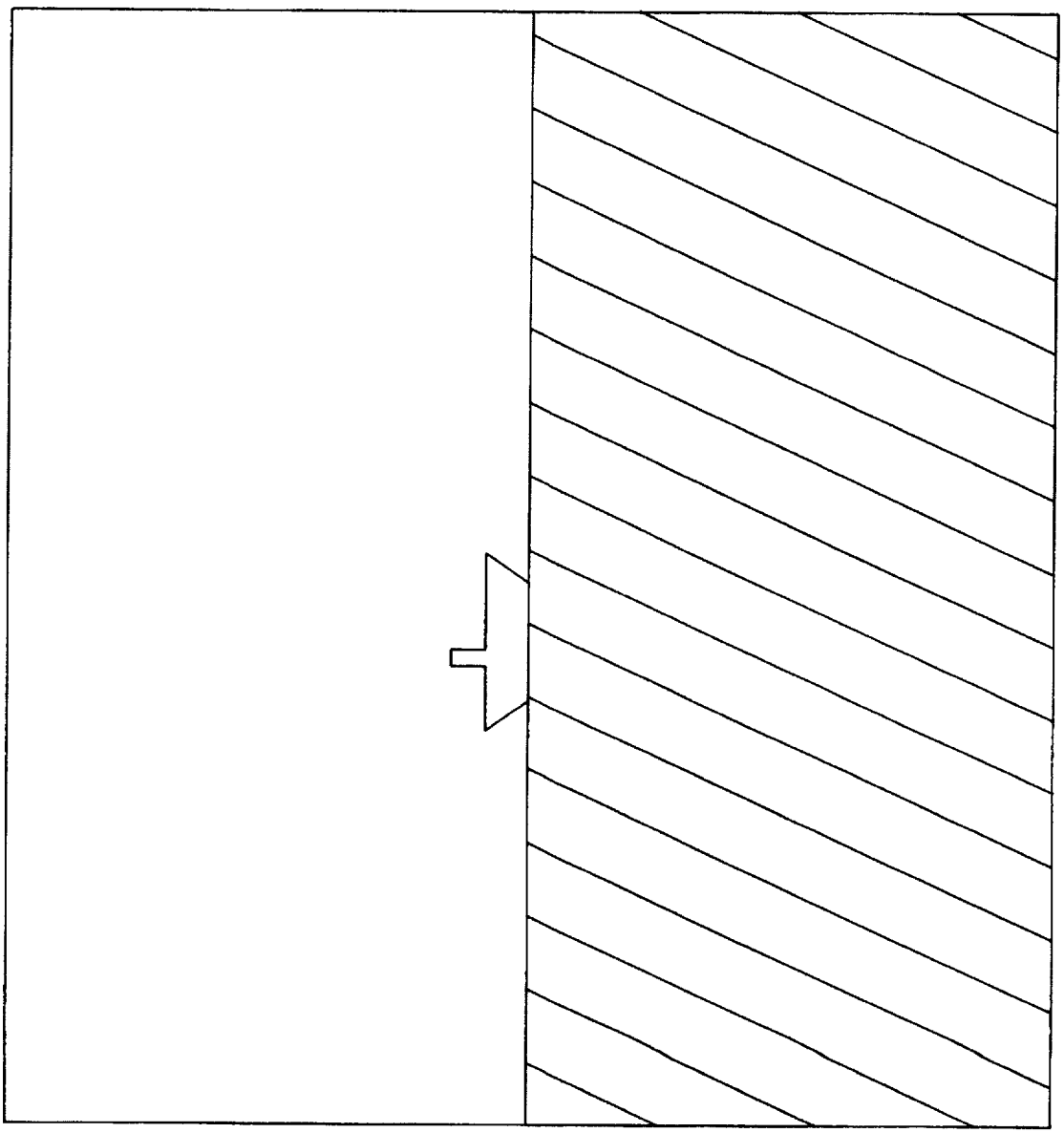
FIG. 20 depicts an example of a object within a scene which may be detected using a CCD array according to an embodiment of the present invention.

This type of detector may be particularly useful for detecting objects having a different polarization than the background in which the object is viewed. For example, FIG. 20 depicts a sketch of an image of a ship on the horizon. The image comprises the ocean, the ship, and the sky. In ordinary circumstances in daylight, the ocean and the sky are both blue. Moreover, the ship may be grey. In general, ordinary array detectors may not be able to detect the presence of the ship on this horizon. However, a polarization CCD array may be used because the ocean and the ship reflect different polarizations of light and the sky is randomly polarized. Therefore, a detector which senses changes in polarization on a horizon may be used for detecting the presence of a ship or other object on that horizon. Other uses for the polarization CCD array detector also exist. Moreover, by using vertically arranged pairs of photodetectors according to the present invention, for example, as depicted in FIG. 19, a compact and cost-effective polarization sensing CCD array may be provided.

According to another embodiment of the present invention, research laboratory instrumentation may be provided. A detector according to the present invention may be used to replace the bulky and expensive equipment used in experimental laboratories working on fiber-optics, lasers, imaging, optical storage, etc.

Other uses and embodiments are also within the scope of the present invention. Other photodetector structures may also be used without departing from the scope of the present invention. For example, photodetector devices for use in the present invention may be formed from GaAs, AlGaAs, InGaAs, InP, InSb, InGaAs, InAlAs, InGaAs, GaAs, AlAs, Ge, Si, SiC, SiGe, GaP, AlP, GaN, AlGaN, InGaN, or InAlGaN. Other photodetector device surfaces may also be used as would be recognized by one of ordinary skill in the art.

What is claimed is:

1. A device for detecting polarization of light comprising:
   a first resonant cavity photodetector tuned to absorb TE polarization;
   a second photodetector; and
   a circuit for comparing an output from the first resonant cavity photodetector and an output from the second photodetector for generating a polarization output.

2. The device of claim 1 wherein the second photodetector is also a resonant cavity photodetector.

3. The device of claim 1 wherein the first resonant cavity photodetector is adjucted to achieve maximum absorption of TE polarization for a predetermined incidence angle and wherein the second photodetector is adjusted to achieve maximum rejection of TE polarization for the predetermined incidence angle.

4. The device of claim 1 wherein the first resonant cavity photodetector and the second photodetector are formed on a common substrate.

5. The device of claim 1 wherein the first resonant cavity photodetector is vertically integrated with the second photodetector.

6. The device of claim 1 wherein the first resonant cavity photodetector comprises:
a first reflective means;
an absorption layer on top of the first reflective means; and
a second reflective means on top of the absorption layer.

7. The device of claim 6 wherein the first reflective means comprises a DBR mirror.

8. The device of claim 6 wherein the second photodetector comprises:
a third reflective means;
a second absorption layer, the third reflective means being on top of the second absorption layer; and
a fourth reflective means, the second absorption layer being disposed between the third reflective means and the fourth reflective means.

9. The device of claim 8 wherein the first reflective means comprises the third reflective means.

10. The device of claim 1 wherein the second photodetector comprises:
a third reflective means; and
a second absorption layer, the third reflective means being on top of the second absorption layer.

11. The device of claim 1 wherein the first resonant cavity photodetector also absorbs TM polarization.

12. The device of claim 10 wherein the third reflective means comprises a DBR mirror.

13. The device of claim 8 wherein the first reflective means comprises the fourth reflective means.

14. A method for detecting polarization of light comprising the steps of:
absorbing TE polarization using a first resonant cavity photodetector;
absorbing TM polarization using a second photodetector; and
comparing an output from the first resonant cavity photodetector and an output from the second photodetector for generating a polarization output.

15. The method of claim 14 wherein the first resonant cavity photodetector is adjusted to achieve maximum absorption of TE polarization for a predetermined incidence angle and wherein the second photodetector is adjusted to achieve maximum rejection of TE polarization for the predetermined incidence angle.

16. The method of claim 14 wherein the second photodetector is a resonant cavity detector.

17. The method of claim 14 wherein the first photodetector has a first length and the second photodetector has a second length and wherein the first length and second length are not equal.

18. A device for detecting polarization of light comprising:
a substrate;
a first resonant cavity photodetector tuned to absorb TE polarization;
a second photodetector disposed on the substrate; and
a circuit for comparing an output from the first resonant cavity photodetector and an output from the second photodetector for generating a polarization output.

19. The device of claim 18 herein the first resonant cavity photodetector is vertically integrated with the second photodetector.

20. The device of claim 19 wherein the first resonant cavity photodetector comprises a top surface which has a size larger in one dimension to match a shape of a beam of the light being detected.

21. A monolithic VLSI device for detecting polarization of light comprising:
a substrate;
a first resonant cavity photodetector tuned to absorb TE polarization and formed on the substrate;
a second resonant cavity photodetector formed on the substrate; and
a circuit for comparing an output from the first and second resonant cavity photodetectors for generating a polarization output.

22. The monolithic device of claim 21 wherein the circuit comprises a microprocessor formed on the substrate.

23. A photodetector system for detecting the positioning of a light source and the polarization of the light generated by the light source comprising:
a plurality of pairs of photodetectors for detecting light from the light source, each pair comprising:
a first resonant cavity photodetector tuned to absorb TE polarization; and
a second photodetector formed on the substrate; and
a circuit for comparing an output from at least one of the first resonant cavity photodetectors and at least one of the second photodetector for generating a polarization output; and
a circuit for comparing an output from each of the first resonant cavity photodetectors from the plurality of pairs with a predetermined output to determine whether the light source is in a predetermined desired position.

24. The photodetector system of claim 23 wherein the plurality of pairs of photodetectors comprise four pairs of photodetectors.

25. A magneto-optical drive reading device comprising:
means for receiving a light reflected from an optical storage medium and detecting polarization of the light comprising:
a first resonant cavity photodetector tuned to absorb TE polarization; and
a second photodetector; and
a circuit for comparing an output from the first resonant cavity photodetector and an output from the second photodetector for generating an output indicating a value stored on the optical storage medium.

26. The magneto-optical drive device of claim 25 further comprising a calibration means for calibrating the magneto-optical drive device.

27. The magneto-optical drive device of claim 26 wherein the calibration means comprises a microprocessor.

28. An array device for detecting polarization of an image comprising:
a plurality of detectors arranged in rows and columns, each detector comprising:
a first resonant cavity photodetector tuned to absorb TE polarization; and
a second photodetector; and
a processor means connected to the plurality of detectors for generating an array of polarization values for an image received by the detectors.

29. The array device of claim 28 each of the first resonant cavity photodetectors and the second photodetectors comprises a surface having a shape which matches a shape of the image being detected.

* * * * *